United States Patent
Nakamura et al.

(10) Patent No.: US 7,830,689 B2
(45) Date of Patent: Nov. 9, 2010

(54) POWER CONVERTER

(75) Inventors: Takayoshi Nakamura, Hitachi (JP);
Kinya Nakatsu, Hitachinaka (JP);
Ryuichi Saito, Hitachi (JP); Takashi Suga, Yokohama (JP); Hiroki Funato, Nagoya (JP)

(73) Assignee: Hitachi, Ltd., Tokyo (JP)

( * ) Notice: Subject to any disclaimer, the term of this patent is extended or adjusted under 35 U.S.C. 154(b) by 307 days.

(21) Appl. No.: 11/933,690

(22) Filed: Nov. 1, 2007

(65) Prior Publication Data
US 2008/0130223 A1 Jun. 5, 2008

(30) Foreign Application Priority Data
Nov. 2, 2006 (JP) .............................. 2006-298375

(51) Int. Cl.
*H02M 1/00* (2007.01)
(52) U.S. Cl. ........................................ 363/141; 363/144
(58) Field of Classification Search ................. 363/141, 363/144; 361/689, 699, 704, 715
See application file for complete search history.

(56) References Cited

U.S. PATENT DOCUMENTS

| 6,898,072 | B2 * | 5/2005 | Beihoff et al. ............... 361/676 |
| 6,940,715 | B2 * | 9/2005 | Beihoff et al. ............... 361/689 |
| 6,965,514 | B2 * | 11/2005 | Beihoff et al. ............... 361/699 |
| 6,972,957 | B2 * | 12/2005 | Beihoff et al. ............... 361/698 |
| 7,095,612 | B2 * | 8/2006 | Beihoff et al. ............... 361/696 |
| 7,177,153 | B2 * | 2/2007 | Radosevich et al. ......... 361/699 |
| 7,187,548 | B2 * | 3/2007 | Meyer et al. ................. 361/699 |

FOREIGN PATENT DOCUMENTS

| CN | 1189005 A | 7/1998 |
| JP | 2001-45601 A | 2/2001 |
| JP | 2002-076236 A | 3/2002 |

\* cited by examiner

*Primary Examiner*—Adolf Berhane
(74) *Attorney, Agent, or Firm*—Crowell & Moring LLP

(57) ABSTRACT

First and second bases and composing a coolant path structure are arranged at the middle stage of the power converter, and semiconductor modules and a capacitor are arranged on both surfaces of the coolant path structure. Furthermore, through-holes are formed in the first and second bases, and cables of DC and AC circuits are laid via the through-holes.

21 Claims, 16 Drawing Sheets

US 7,830,689 B2

POWER CONVERTER

CLAIM OF PRIORITY

The present application claims priority from Japanese application serial No. 2006-298375, filed on Nov. 2, 2006, the content of which is hereby incorporated by reference into this application.

FIELD OF THE INVENTION

The present invention relates to a power converter for converting DC power to AC power or a power converter for converting AC power to DC power.

BACKGROUND OF THE INVENTION

As a system that wheels are driven by output of a rotary electric machine and a vehicle travels, there are a hybrid system of driving wheels on the basis of output of an engine or both engine and rotary electric machine and a system of driving wheels only by rotary electric machine. In either of the systems, the DC power is converted to AC power by the power converter and the AC power is supplied to the rotary electric machine for driving wheels. On the basis of the supplied power, the rotary electric machine generates rotating torque, and the wheels are driven by the rotating torque, thus the vehicle travels.

The rotary electric machine for driving wheels is required for large torque output, thus the power supplied to the rotary electric machine from the power converter is increased, and the internal heat of the power converter is apt to increase.

Further, an example relating to the cooling structure of the power converter for vehicle is disclosed in Japanese Patent Laid-open No. 2001-45601.

SUMMARY OF THE INVENTION

The output required for the rotary electric machine is increased and in correspondence to it, the power supplied to the rotary electric machine is apt to increase. The internal heat of the power converter for controlling the aforementioned supply power is also apt to increase. It is necessary to take a countermeasure for the internal temperature rise of the power converter accompanying the increase in the heat. On the other hand, the power converter for vehicle must be installed in the limited space of the vehicle and the volume of the power converter cannot be increased excessively. Therefore, it is necessary to examine so as to make the power converter comparatively compact.

An object of the present invention is to provide a converter for suppressing an increase in the volume as far as possible.

In the present invention, a power semiconductor circuit in which a coolant path structure forms a coolant path for letting a coolant pass, and a capacitor connected to a DC circuit is arranged on one side of the coolant path structure, and a power semiconductor chip for converting DC power to AC power is provided is installed on the other side of the coolant path structure. By use of this structure, the cooling ability of the power converter can be improved and the volume of the power converter can be suppressed from increasing.

Further, in the embodiments which will be explained hereunder, a connecting wire for electrically connecting the aforementioned capacitor and power semiconductor circuit is arranged so as to penetrate the coolant path structure. By use of this structure, the volume of the apparatus can be made comparatively small.

According to the present invention, the volume of the power converter can be prevented from increasing.

DESCRIPTION OF THE PREFERRED EMBODIMENTS

The embodiments explained hereunder have the effect of improving the cooling ability of the power converter and also the effects indicated below.

(1) The structure of the embodiments has an effect of reducing the volume of the power converter. For example, the arrangement of the power semiconductor circuit, capacitor, and coolant path structure can be stored in a comparatively small volume and the overall volume of the power converter can be made smaller.

(2) The internal inductance of the power converter can be made smaller. Particularly, the inductance of the DC circuit for connecting the power semiconductor circuit and capacitor can be made smaller. The voltage rise based on the on operation or off operation of the power semiconductor circuit is proportional to a change in the inductance or current. In the embodiments indicated below, the internal inductance of the power converter can be made smaller, so that even if the on or off operation speed of the power semiconductor circuit is increased, the voltage rise due to the internal inductance can be suppressed low. The electric parts can be prevented from damage due to a high voltage.

(3) As explained in (2), the on or off operation speed of the power semiconductor circuit is increased, thus the heat of the power semiconductor circuit can be reduced. Particularly, the heat of the power semiconductor circuit during the off operation is high, so that the off operation of the power semiconductor circuit is speeded up, thus the heat of the off operation can be suppressed. As a result, the temperature rise of the power semiconductor circuit can be suppressed low.

(4) The productivity of producing a power converter is improved. For example, in the chamber on one side of the coolant path structure, the power semiconductor circuit and control circuit board are arranged, so that even if any fixing parts or wiring parts of the board are dislocated from the tool during operation and fall, the dislocated parts are prevented from falling in the chamber on the other side of the coolant path structure. By use of this structure, the fallen parts can be removed immediately and the productivity is improved. Further, even if the surface of a high-voltage and large-current wire is exposed without insulating it, the aforementioned parts can be prevented from failing in taking out or prevented from entering the other space, so that the safety can be maintained.

(5) The embodiments explained below have effects in addition to the effects aforementioned and those effects will be described in the following explanation.

Figure 1:
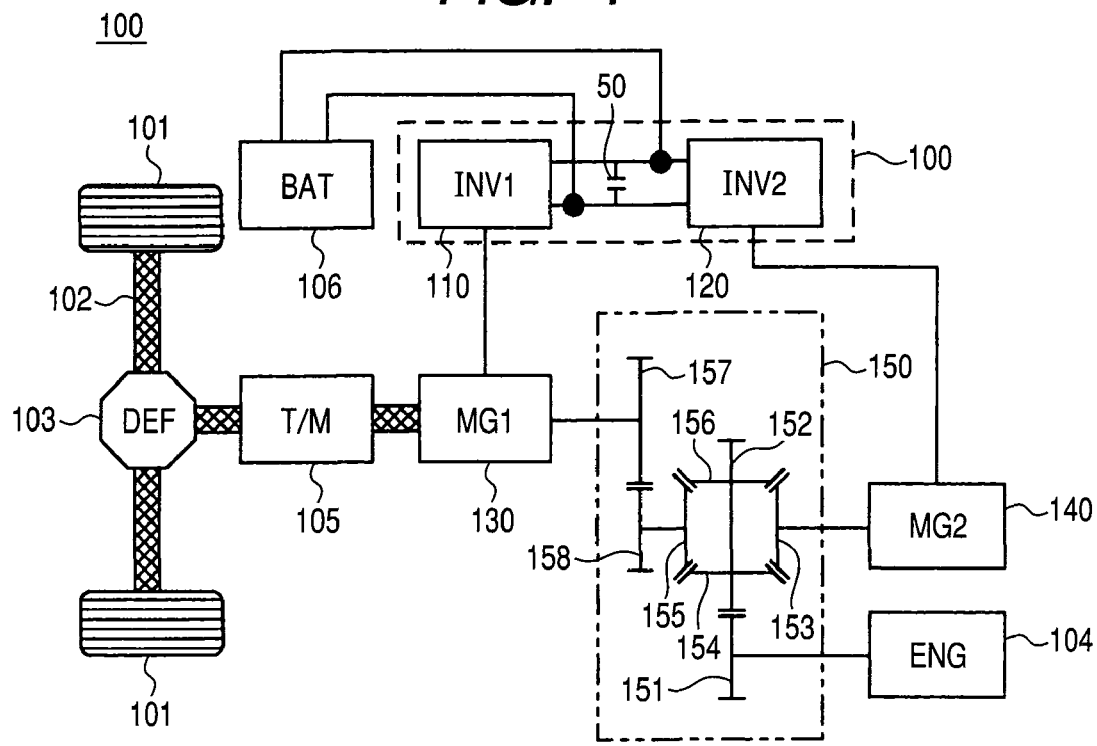
FIG. 1 is a system diagram of a hybrid electric vehicle.

FIG. 1 is a system diagram of a hybrid electric vehicle using the power converter to which the present invention is applied. In the electric vehicle, there are a hybrid type having an engine and a type having no engine, and the following embodiments can be applied to either of the types, though here, an electric vehicle of a hybrid type will be explained as an example. However, the power converter of the present invention, as mentioned above, can be used for a pure electric vehicle having no engine.

The hybrid electric vehicle (hereinafter, referred to as "HEV") has two drive systems such as an electrical drive system and a mechanical drive system for traveling the vehicle. One is an engine drive system using an engine 104 which is an internal combustion engine as a drive source. The other one is a drive system by a rotary electric machine. In the embodiments indicated below, the rotary electric machine has both functions of a motor and a generator and according to the travelling condition, is operated as a motor or is operated a generator. Hereinafter, the rotary electric machine acting as a motor or a generator is referred to as a motor generator. This system has two motor generators 130 and 140.

On the front of the body of the vehicle (not shown), a front-wheel axle 102 is born rotatably and at both ends of the front-wheel axle 102, a pair of axles 101 are installed. The rear wheel of the body of the vehicle is not drawn. The HEV of this embodiment adopts the so-called front-wheel drive, though it may adopt the rear-wheel drive.

By the torque generated by the motor generator 130 or 140 or the engine 104, the vehicle travels. On the input side of the motor generator 130, the output side of the engine 104 and the output side of the motor generator 140 are mechanically connected via a power distribution system 150. On the input side of a transmission (T/M) 105, the output side of the motor generator 130 is connected mechanically. The torque generated by the motor generator 130 or 140 or the engine 104 is added to the input side of the transmission (T/M) 105. The added torque is varied in speed by the transmission 105 and is transferred to a DEF 103 which is a differential power distribution system for distributing the rotation drive force to the left and right front-wheel axles 102. The rotation torque distributed by the DEF 103 is transferred to the wheels 101 via the front-wheel axles 102 and the vehicle travels.

The power distribution system 150 is a differential system composed of cog wheels 151 to 158. Here, the cog wheels 153 to 156 are bevel gears and the cog wheels 151, 152, 157, and 158 are spur gears. The power of the motor generator 130 is transferred to the power distribution system 150. The axle of the motor generator 130 is coaxial with the cog wheel 157. Therefore, when there is no drive power supplied to the motor generator 130, the power transferred to the cog wheel 157 is transferred straight to the input side of the power distribution system 150. When the cog wheel 151 is driven by the operation of the engine 104, the power of the engine 104 is transferred from the cog wheel 151 to the cog wheel 152, then from the cog wheel 152 to the cog wheels 154 and 156, then from the cog wheels 154 and 156 to the cog wheel 158, and finally to the cog wheel 157. When the cog wheel 153 is driven by the operation of the motor generator 140, the rotation of the motor generator 140 is transferred from the cog wheel 153 to the cog wheels 154 and 156, then from the cog wheels 154 and 156 to the cog wheel 158, and finally to the cog wheel 157. Further, as a power distribution system 150, another system such as a planetary gear system may be used.

The motor generator 130 is a synchronous machine having a permanent magnet for a magnetic field in a rotor, and the AC power supplied to an armature coil of a stator is controlled by an inverter 110, thus the output torque thereof is controlled. The motor generator 140 is also a synchronous machine similarly to the motor generator 130, and the AC current supplied by an inverter 120 is controlled, and the generated toque is controlled. To the inverters 110 and 120, a battery 106 is connected electrically, and when the rotary electric machine is operated as a motor, DC power is supplied to the inverters 110 and 120 from the battery 106, and the DC power is converted to AC power, and the AC power is supplied to the motor generators 130 and 140 which are a rotary electric machine. On the other hand, when operating the motor generators 130 and 140 which are a rotary electric machine as a generator, the AC power generated by the rotary electric machine is converted to DC power by the inverter 110 or 120, and the converted DC power is supplied to the battery 106 from the inverter 110 or 120.

This embodiment has a first motor/generator unit composed of the motor generator 130 and inverter 110 and a second motor/generator unit composed of the motor generator 140 and inverter 120 and uses them appropriately according to the operation condition. Namely, when traveling the vehicle mainly by the rotation torque generated by the engine 104 and assisting supplementarily the travel of the vehicle by the output of the rotary electric machine, the second motor/generator unit is generation-operated, and rotation torque is added to the motor generator 140 by a part of the generated torque of the engine 104, thus 3-phase AC power is generated. By the power obtained by the power generation, the first motor/generator unit is operated as a motor unit. Namely, the motor generator 130 is operated as a motor. In the similar case, when accelerating the vehicle, the first motor/generator unit is operated as a generator unit and by the torque generated by the engine 104, the motor generator 130 is operated as a generator. By the power obtained by the generation operation, the second motor/generator unit is operated as a motor unit and is operated as a motor.

In this embodiment, the power of the battery 106 is supplied to the motor generator 130 of the first motor/generator unit, and the first motor/generator unit is operated as a motor unit, thus the vehicle can travel only by the output torque of the motor generator 130 without using the torque of the engine 104.

Furthermore, in this system, when both first motor/generator unit and second motor/generator unit are operated as a generator unit for executing generation and operation, by the power of the engine 104 or the rotation torque transferred from the wheels 101, the motor generator 130 and motor generator 140 can be operated as a generator, and the generation power is converted to DC power, and the AC power is converted to DC power by the inverter 110 or 120 of the first or second motor/generator unit, thus the battery 106 can be charged.

In the system shown in FIG. 1, the inverters 110 and 120 and capacitor 50 compose the power converter 100. The power converter 100 stores the two inverters 110 and 120 in one housing so as to store them in a small-volume space and furthermore stores the capacitor 50. This embodiment produces an effect of making a necessary storing space comparatively small. However, there is no need always to store the two inverters 110 and 120 and one inverter may be stored.

Figure 2:
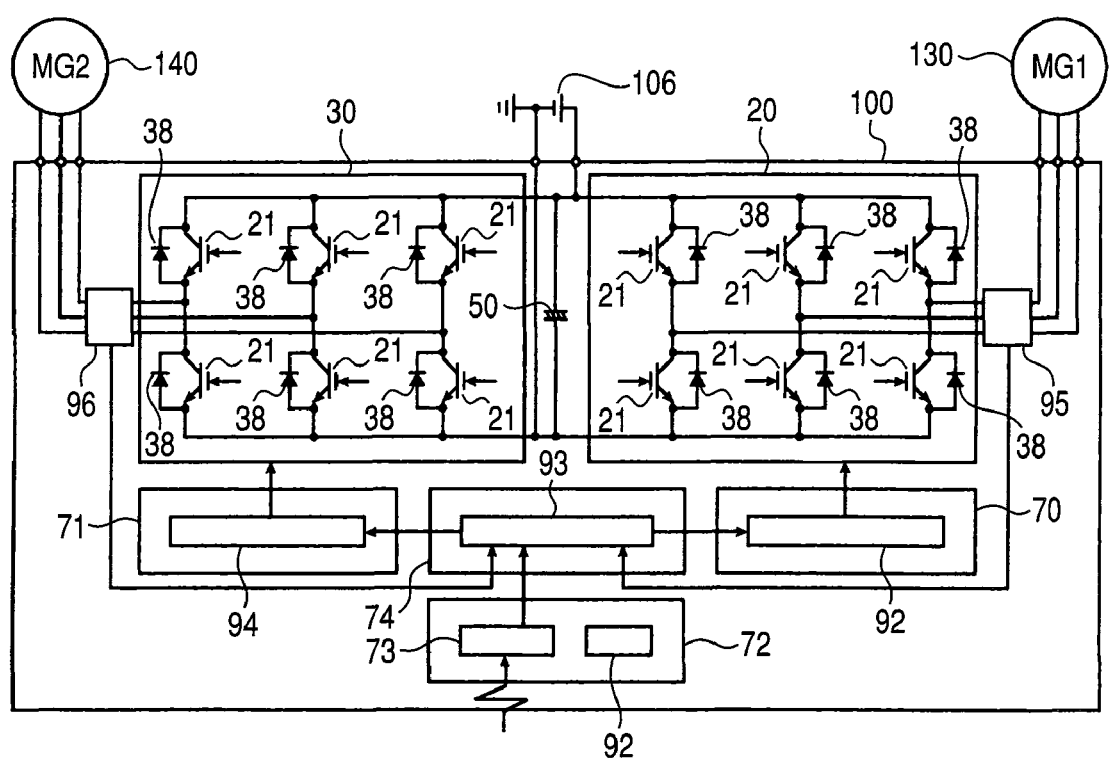
FIG. 2 is a drawing for explaining the electric circuit of the power converter 100.

Next, the electric circuit of the power converter 100 will be explained by referring to FIG. 2. The power converter 100 has the inverters 110 and 120 aforementioned. The power converter 100 of this embodiment performs an operation of merging the functions of the inverters 110 and 120. In the power converter 100, a semiconductor module 20 for the inverter 110, a semiconductor module 30 for the inverter 120, the capacitor 50, a drive circuit 92 for the inverter 110 mounted on a drive circuit board 70, a drive circuit 94 for the inverter 120 mounted on a drive circuit board 71, a control circuit 93 mounted on a control circuit board 74 for controlling both inverters 110 and 120, a discharge drive circuit 91 for driving the discharge circuit (not drawn) of a connector 73 mounted on a connector board 72 and the capacitor 50, and current sensors 95 and 96 are installed.

The semiconductor modules 20 and 30 compose a main circuit for converting power of the corresponding inverters 110 and 120 and have a plurality of power semiconductor devices for switching. As a power semiconductor device, an IGBT (insulated gate bipolar transistor) having a low electric resistance is used, though a MOS transistor (metal oxide semiconductor/field effect transistor) may be used. However, the MOS transistor has a slightly higher on-state resistance than the IGBT. The semiconductor modules 20 and 30 are respectively operated upon receipt of drive signals outputted from the corresponding drive circuits 92 and 94, convert the DC power supplied from the high-voltage battery 106 to 3-phase AC power, and supply the power to the armature winding of the corresponding motor generator 130 or 140. The main circuits of the semiconductor modules 20 and 30 are a 3-phase bridge circuit and the series circuits of three phases are structured so as to be electrically connected in parallel between the positive terminal and the negative terminal of the battery 106.

To the semiconductor modules 20 and 30, three sets of series circuits composed of two IGBTs 21 are serially connected between the positive terminal and the negative terminal of the DC circuit. Each of the aforementioned serial circuits is an arm, and the power semiconductor device for switching of the upper arm and the power semiconductor device for switching of the lower arm are electrically connected serially, thus, as mentioned above, the aforementioned serial circuits are structured. In this embodiment, as a power semiconductor device for switching, the IGBTs 21 are used and each of the IGBTs 21 has three electrodes of a collector, an emitter, and a gate. Between the collector and the emitter of each of the IGBTs 21, a diode 38 is connected electrically. The diode 38 has two electrodes of the cathode and anode and so as to form the direction from the emitter of the IGBT 21 to the collector thereof as a forward direction, the cathode and anode are respectively connected electrically to the collector and emitter of the IGBT 21.

As mentioned above, as a power semiconductor device for switching, a MOSFET may be used. The MOSFET has three electrodes of a drain, a source, and a gate. Further, the MOSFET, between the source and the drain, has a parasitic diode having a forward direction from the drain to the source, so that there is no need to install separately a diode like the IGBT.

As mentioned above, in the arms of each phase, the source of the IGBT 21 which is an upper arm and the drain of the IGBT 21 which is a lower arm are electrically connected serially. Further, in this embodiment, the upper and lower arms of each phase are composed of one IGBT, though when the current supplied to the rotary electric machine is large, it is possible to electrically connect serially a plurality of IGBTs to form upper and lower arms. In this embodiment, as described later, the upper and lower arms of each phase are composed respectively of three IGBTs. When the current amount supplied to the rotary electric machine is small, the number of parallel connections aforementioned is eliminated and when the current capacity is low, the upper and lower arms can be composed respectively of one semiconductor device. Inversely, when the current is large, the number of parallel connections of semiconductor devices composing each of the upper and lower arms is increased, though the unbalance of the switching operation by the semiconductor devices connected in parallel leads to current unbalance, thus there is a danger of concentration of the current to partial semiconductor devices. In consideration of the current unbalance, it is desirable to set the parallel connection of 3 or 4 semiconductor devices as an upper limit, that is, use a maximum of 3 or 4 semiconductor devices.

The drain of the IGBT 21 of each upper arm of each phase is connected electrically to the positive terminal of the battery 106 and the source of the IGBT 21 of each lower arm of each phase is connected electrically to the negative terminal of the battery 106. The middle point (the connection part of the source of the IGBT of the upper arm and the drain of the IGBT of the lower arm) of each arm of each phase is connected electrically to the armature winding of the corresponding motor generator 130 or 140.

The drive circuits 92 and 94 are a drive circuit for permitting the corresponding inverter 110 or 120 to perform the switching operation, that is, for turning it on or off and on the basis of a control signal (a control value) outputted from the control circuit 93 for controlling the inverter, generates a drive signal for driving the corresponding IGBT 21. The drive signals generated in the respective circuits are outputted to the corresponding semiconductor modules 20 and 30. The drive circuits 92 and 94 are composed of the so-called 6 in 1 type integrated circuit for integrating a plurality of circuits corresponding to each of the upper and lower arms of each phase to one circuit. As a circuit corresponding to each of the upper and lower arms of each phase, the drive circuits 92 and 94 have an interface circuit, a gate circuit, and an abnormal detection circuit.

The control circuit 93 has a micro computer and receives a target torque signal from a host controller and a detection signal (sensor value) from the current sensor 95 or 96 or the rotation sensor installed in the motor generator 130 or 140, calculates the switching operation timing of each of the IGBTs 21 which is a semiconductor device for generating a 3-phase AC current supplied to the motor generators 130 and 140, and outputs it to the drive circuits 92 and 94.

The connector 73 is a connector of the communication circuit for electrically connecting the controllers inside and outside the power converter 100. Further, the capacitor 50 composes a smoothing circuit for performing an action for suppressing fluctuation in the DC voltage caused by the operation of the IGBT 21 and is electrically connected in parallel to the DC terminals of the semiconductor modules 20 and 30. The discharge drive circuit 91 is used to drive the discharge circuit (not drawn) installed to discharge the charge stored in the capacitor 50. When the discharge drive circuit 91 is operated, the charge stored in the capacitor 50 is discharged via a resistor not drawn.

In this embodiment, the semiconductor modules 20 and 30 for controlling the motor generators 130 and 140 which are second class rotary electric machines are arranged in one apparatus together with the shared capacitor 50. Therefore, the volume required for the system can be made smaller as a whole and it can be loaded in a comparatively small space of the vehicle. Further, the productivity is improved.

Next, the constitution of the power converter 100 will be explained by referring to FIGS. 3 to 8. The power converter 100 includes a lower housing 13, a second base 12 arranged on the lower housing 13, a first base 11 arranged on the second space, and an upper housing 10 installed on the first base 11. The exterior of the power converter 100 is a rectangular solid container with rounded corners. The housing is made of aluminum and is thermally conductive.

The first base 11 and second base 12 compose a coolant path structure internally forming a coolant path. The housing is internally divided vertically into at least two parts by the laminar first base 11 and π-shaped second base 12 and furthermore is divided into several chambers. The divided chambers are surrounded by a thermally conductive material, for example, aluminum, thus efficiently coolable chambers are formed. In coolant paths 28 formed by the first base 11 and second base 12, a coolant is let flow.

In this embodiment, the coolant may be exclusive coolant of the power converter 100, though in consideration of simplification of the overall body of the vehicle and reduction in the burden of both parties, engine coolant is used. Therefore, the coolant is heated up by the engine to a comparatively high temperature, thus the cooling ability is lowered in correspondence to it, though the power converter 100 has a structure suited to increase the cooling efficiency and a sufficient cooling function is obtained by the engine coolant.

The power converter is divided into two parts by the first base 11 and second base 12, and the coolant paths 28 are formed by the first base 11 and second base 12, thus the thermal effect between the two cooling chambers divided by the first base 11 and second base 12 can be eliminated. When the semiconductor modules 20 and 30 are arranged on one of the coolant paths 28 and the capacitor 50 is arranged on the other one thereof, an apparatus having an excellent storage efficiency for preventing the mutual thermal effect and storing them all in a small volume can be obtained.

In this embodiment, on one side of the coolant path structure formed by the first base 11 and second base 12, the semiconductor modules 20 and 30 are installed in parallel along the long side of the coolant path. By doing this, the semiconductor modules 20 and 30 are cooled by the coolant of the coolant paths 28. The heat generated by the semiconductor device, in this embodiment, the IGBT 21 is cooled by the engine coolant. Therefore, the cooling efficiency is improved.

The coolant paths 28 are arranged along the long sides of the housing, and on one of the short sides of the housing, an inlet 15 for introducing coolant is installed on one of the coolant paths 28 installed together and an outlet 16 for discharging coolant from the other one of the coolant paths 28 installed together. In this embodiment, the two coolant paths 28 are installed side by side and are formed in parallel along the long sides of the housing, and the opposite sides thereof to the inlet 15 or outlet 16 are connected with each other, that is, the coolant paths 28 are formed in a U shape, and coolant flowing through one of the coolant paths 28 flows into the other coolant path 28 from the end thereof, flows in the other coolant path 28, then is discharged from the outlet 16, and is sent to the radiator (not illustrated) of the vehicle.

In the first base 11, openings are formed along the coolant paths 28 and these openings are structured so as to be sealed by cooling plates 23 of the semiconductor modules 20 and 30. The cooling plates 23 are laminar materials formed in a rectangular shape extending from one of the long sides of the housing to the other one thereof along the cooling paths 28 for sealing the openings of the coolant paths 28. The cooling plates 23 are equipped with cooling fins on the surfaces thereof on the cooling path side and in the state that the openings are sealed by the cooling plates 23, the cooling fins are structured so as to be projected into the coolant paths 28. Therefore, the cooling plates 23 are cooled efficiently by the engine coolant flowing in the coolant paths 28. The cooling plates 23 are made of a thermally conductive copper material and the quality of the material is hardened by mixing an impurity in the copper. A high-purity copper plate is acceptable. However, although the high-purity copper plate is excellent in thermal conductivity, it is soft and there are possibilities that the flatness thereof may be impaired due to brazing of the fins, and the chip of the IGBT 21 is hardly fixed. Therefore, when the cooling plates 23 are large, compared with the high-purity copper plate, the copper plate hardened by adding an impurity is excellent in workability.

Figure 4:
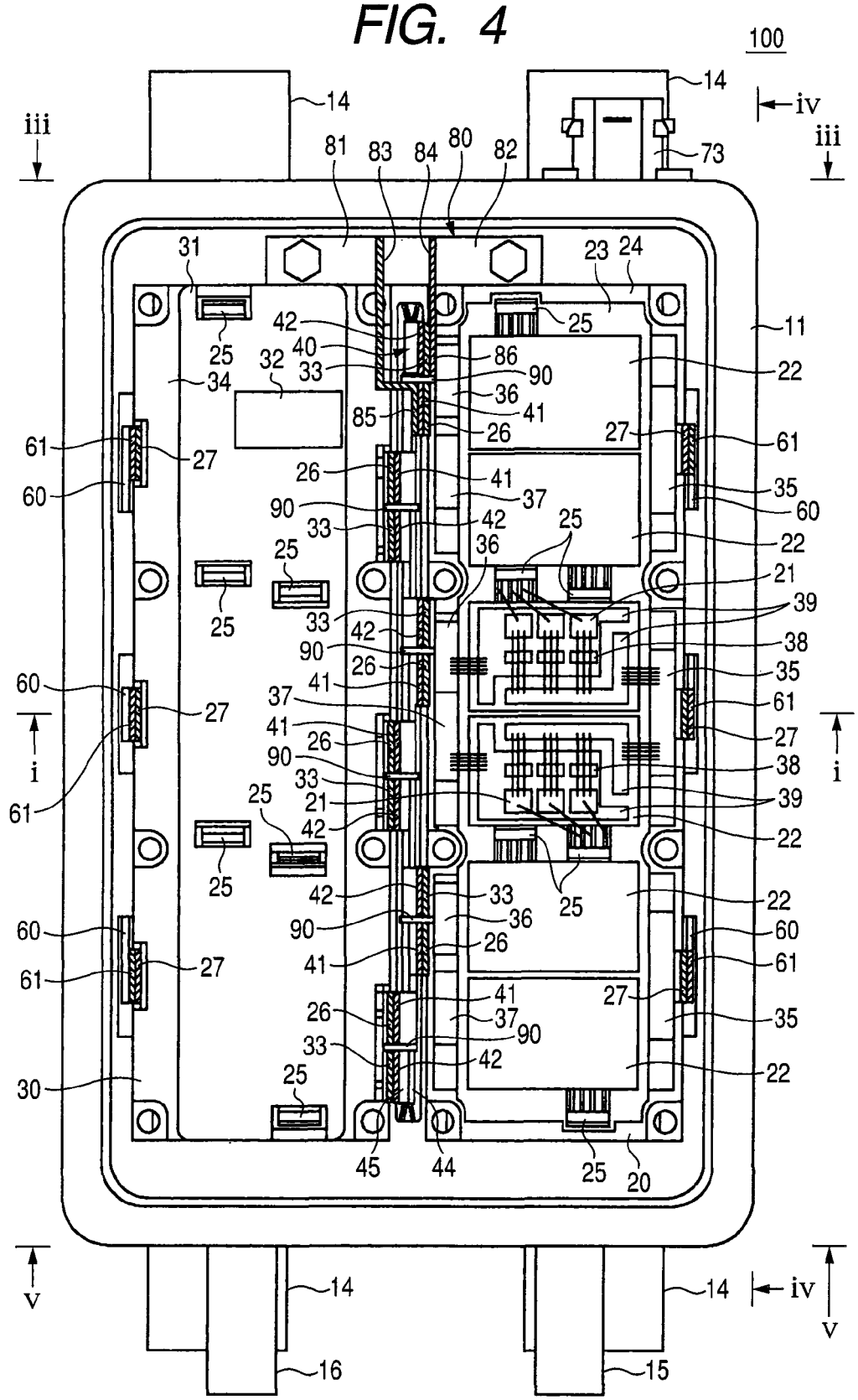
FIG. 4 is a cross sectional view for explaining the structure of the power converter 100.

In FIG. 4, the two semiconductor modules 20 and 30 are shown and the semiconductor module 20 is uncovered so that it can be seen internally. On one surface of the cooling plate 23 (not displayed in FIG. 4), the cooling fins are installed, and on the other surface of the cooling plate 23, that is, on the top of the cooling plate 23, a module case 24 having a wall rising along the outer periphery of the cooling plate 23 is installed. The cooling plate 23 is almost in a rectangular shape and the module case 24 extends along the long sides of the rectangle. The cooling plate 23 has 8 screw holes and is fixed to the first base 11 which is a part of the coolant path structure by screws via the screw holes so as to seal the openings. The cooling plate 23 is divided into three areas along the long sides of the rectangle, and in each of the areas, as shown in FIG. 4, a storage chamber is formed, and in each storage chamber, the diode composing the upper and lower arms of the inverter circuit and the IGBT chip are stored. In FIG. 4, the semiconductor module 20, so that the storage condition of the chip can be seen, is shown in the state that the upper cover thereof is removed. Furthermore, in the central area of the semiconductor module 20, so that the chip arrangement can be seen, the chip arrangement and a metal pattern 39 are shown. In the other areas, the recording of the chip arrangement and the metal pattern 39 is omitted.

To one of the side walls extending along the long sides of the module cases 24 installed in the semiconductor modules 20 and 30, a module DC terminal is fixed and to the other side, a module AC terminal is fixed. The module DC terminal is composed of a negative module DC terminal 26 and a positive module DC terminal 33 and the terminals are installed respectively in correspondence with the storage chambers. The positive module DC terminal 33 and negative module DC terminal 26, as shown in the drawing, are projected upward from the side walls of the module cases 24. The end of the DC terminal on the opposite side of the projection sides of the positive module DC terminal 33 and negative module DC terminal 26 penetrates the module case 24 made of resin and as shown in FIG. 4, enters the storage chamber of the semiconductor module and the surface thereof is exposed on the surface of the module case 24. By doing this, in each storage chamber, an inside electrode 36 of the positive terminal and an inside electrode 37 of the negative terminal are formed.

In FIG. 4, in each storage chamber of the semiconductor module, the metal pattern 39 is installed and between the metal patterns, three semiconductor chips composing each of the upper and lower arms are arranged and fixed in parallel. Inside FIG. 4, that is, on the central side, the negative module DC terminal 26 and positive module DC terminal 33 are arranged and outside FIG. 4, a module AC terminal 27 is arranged.

As shown in FIG. 4, the semiconductor modules 20 and 30 installed side by side, so that the negative module DC terminal 26 and positive module DC terminal 33 approach each other and on the other hand, the module AC terminal 27 is separated from them, are fixed in the state that to one semiconductor module, the other semiconductor module is rotated in a 180° arc. On the side wall extending along the long sides of the module case 24 positioned on the opposite side of the facing sides of the semiconductor modules 20 and 30, the module AC terminal 27 is installed in correspondence with each storage chamber. The module AC terminal 27 is projected upward from the side wall of the module case 24. Regarding the module AC terminal 27, the end on the opposite side of the projection side thereof enters each storage chamber of the semiconductor module and the surface thereof is exposed on the surface of the module case. By doing this, inside each storage chamber, an AC inside electrode 35 is formed and is connected to the semiconductor chip for the upper arm and semiconductor chip for the lower arm.

On the approaching sides of the semiconductor modules 20 and 30 arranged in parallel like this, the respective module DC terminals are arranged, so that the DC cable can be shortened and the electric resistance can be reduced. Due to reduction in the electric resistance, the heat generation can be suppressed, and the heat generation of the DC circuit for connecting the semiconductor modules 20 and 30 and capacitor can be reduced, and the temperature rise can be suppressed.

On the approaching sides of the semiconductor modules 20 and 30 arranged in parallel as mentioned above, the respective module DC terminals are arranged, so that the inductance of the DC circuit can be reduced and even if the operation speed of the inverter is increased, due to the reduction in the inductance, the voltage rise by the inductance is made smaller. By suppressing the voltage rise, the operation speed of the inverter can be increased, and due to the increase in the operation speed, the heat generation time during the switching operation can be shortened, and as a result, the heat can be reduced. Particularly, the heat when the semiconductor device is switched from the on state to the off state is large, and by shortening the switching time, the time in the operation state generating a large amount of heat can be shortened, and the heat per unit time during operation can be suppressed. As a result, an effect of suppressing the temperature rise in the power converter is obtained.

In the semiconductor module 20 specially shown in FIG. 4 so that the inside thereof can be seen, on the top of the cooling plate 23 of each storage chamber, 3 sets of insulation boards composed of 2 insulation boards 22 are installed in parallel along the long sides of the housing. However, the center set is shown in detail so as to explain the chip arrangement. For the other two sets, to avoid the complication of recording, the recording of the internal electric circuit including the semiconductor chip and metal pattern 39 is omitted. On the top of each of the insulation boards 22, two laminar metal patterns 39 are installed side by side along the long sides of the housing. One of the metal patterns 39 installed on one of the two insulation boards 22 in each storage chamber is connected electrically to the inside electrode 36 of the positive terminal. One of the metal patterns 39 installed on the other one of the two insulation boards 22 in each storage chamber is connected electrically to the inside electrode 37 of the negative terminal. The other ones of the metal patterns 39 installed on the two insulation boards 2 of each storage chamber are respectively connected electrically to the AC inside electrodes 35. These electric connections are realized by a conductive wire 29. Further, means other than the wire may be used for connection. The semiconductor module 20 is explained above, though the semiconductor module 30 has the same structure.

On the top of one of the metal patterns 39 installed on the two insulation boards 22 of each storage chamber, 3 sets of the IGBT 21 and diode 38 arranged side by side along the long sides of the housing are mounted in parallel along the short sides of the housing. Namely, the upper and lower arms of each phase have respectively a structure that 3 sets of the IGBT 21 and diode 38 are connected in parallel. The IGBT 21 and diode 38 are connected electrically to the metal pattern 39 connected electrically to the AC inside electrode 35. The gate of the IGBT 21 is connected electrically to the connector 25. These electric connections, as shown in FIG. 4, are realized by the conductive wire 29. The connector 25 is installed in each of the four side walls for forming the three areas of the top of the cooling plate 23 of the module case 24.

On the upper part of the module case 24, a laminar module case cover 34 is installed. The module case cover 34 composes a ceiling wall for covering the upper opening of the module case 24 and sealing the storage chamber and is molded with the same resin as that of the module case 24. On the top of the module case cover 34, a wiring board 31 and a wiring connector 32 connected electrically to the wiring board 31 are installed. The wiring board 31 is connected electrically to the connector 25 projected upward from the through-hole formed in the module case cover 34. The wiring connector 32 is connected electrically to the drive circuits 92 and 94 of the drive circuit boards 70 and 71 with a cable not drawn.

In the lower cooling chamber of the housing, the capacitor 50, drive circuit boards 70 and 71, control circuit board 74, and connector board 72 are stored.

The capacitor 50, so as to be arranged near by the DC sides of the semiconductor modules 20 and 30, is arranged under the central part (the area surrounded by two π legs) of the second base 12. The capacitor 50 is composed of 4 electrolytic capacitors having a cross section in an elliptic shape in the height direction of the housing. Regarding the four electrolytic capacitors, so as to permit the long sides thereof to coincide with the long sides of the housing, two pieces are respectively installed side by side along the long sides and short sides of the housing and are stored in a capacitor case 51 via a band 52. The capacitor case 51 is a container with the top thereof opened which is made of a thermally conductive material and the flange on the upper part of the case is in contact with the lower parts of the two legs of the second base 12 formed in a π shape. Therefore, between the capacitor 50 and the coolant paths 28, a thermally conductive structure can be formed and the capacitor 50 can be cooled efficiently by a coolant.

Each electrolytic capacitor is held by a case 53 and has a positive capacitor terminal 57 and a negative capacitor terminal 56 passing through a capacitor cover 54 for sealing the upper opening thereof. The positive capacitor terminal 57 and negative capacitor terminal 56 are in a laminar shape, are opposite to each other so that the short sides thereof face each other, and hold a laminar insulation material 55 formed integrally with the capacitor cover 54 along the short side. The capacitor terminals, when the four electrolytic capacitors are stored in the capacitor case 51, are installed so that the electrolytic capacitors neighboring along the short sides are different in the position along the long sides.

The drive circuit board 70 is arranged in the area which is positioned under the second base 12 of the semiconductor module 20 and is surrounded by one of the π-shaped legs and the flange of the second base 12. The drive circuit board 71 is arranged in the area which is positioned under the second base 12 of the semiconductor module 30 and is surrounded by one of the π-shaped legs and the flange of the second base 12. The drive circuit boards 70 and 71 are connected thermally to the second base 12. Therefore, the coolant paths 28 and drive circuit boards 70 and 71 can be connected by a thermally conductive structure and the drive circuit boards 70 and 71 can be cooled by an engine coolant.

The control circuit board 74 is installed so as to face one of the short sides of the capacitor case 51 (on the side of the semiconductor module 30). The control circuit board 74 is connected thermally to the second base 12. Therefore, the coolant paths 28 and control circuit board 74 can be connected by a thermally conductive structure and the control circuit board 74 can be cooled by an engine coolant.

The connector board 72 is installed so as to face the other one of the short sides of the capacitor case 51 (on the side of the semiconductor module 20). The connector board 72 is connected thermally to the second base 12. Therefore, the coolant paths 28 and connector board 72 can be connected thermally and the connector board 72 can be cooled by a coolant. The connector board 73 is projected externally from the other one of the long sides of the housing.

The capacitor 50 and semiconductor modules 20 and 30 are connected electrically with a DC busbar 40. The DC busbar 40 is arranged in holes 1212 and 1112 formed at the central part of the first base 11 and the central part of the second base 12 and via these holes, the terminal of the capacitor 50 and the DC terminals of the semiconductor modules 20 and 30 are connected.

The DC busbar 40 has a structure that a laminar positive DC busbar 45 extending along the long sides of the housing and a laminar negative DC busbar 44 extending along the long sides of the housing are laminated along the short sides of the housing across an insulation sheet 43. A module terminal 42 of the positive DC busbar 45 is connected electrically to the positive module DC terminals 33 of the semiconductor modules 20 and 30 and a positive capacitor terminal 47 of the negative DC busbar 45 is connected to a positive capacitor terminal 57 of the capacitor 50. Therefore, by the positive busbar 45 of the DC busbar 40 forming a laminating structure, the positive module DC terminals 33 of the semiconductor modules 20 and 30 and the positive capacitor terminal 57 of the capacitor 50 are connected electrically. A module terminal 41 of the negative DC busbar 44 of the busbar 40 forming a laminating structure is connected to the negative module DC terminals 26 of the semiconductor modules 20 and 30 and a negative capacitor terminal 46 of the negative DC busbar 44 is connected to the negative capacitor terminal 56 of the capacitor 50. Therefore, by the negative DC busbar 44 of the DC busbar 40 forming a laminating structure, the negative module DC terminals 26 of the semiconductor modules 20 and 30 and the negative capacitor terminal 56 of the capacitor 50 are connected electrically.

The negative DC busbar 44 and positive DC busbar 45 form a laminating structure holding the insulation sheet 43 between them, so that the inductance of the DC circuit between the semiconductor modules 20 and 30 and the capacitor 50 can be reduced. The reduction in the inductance is effective in reducing the voltage rise due to current variations. When intending to suppress the voltage rise to less than a predetermined voltage in consideration of breakdown voltages of the circuit and electrical parts, by lowering the inductance, the switching speed of the IGBT 21 which is a semiconductor device composing each of the upper and lower arms can be increased. When the switching speed of the IGBT 21 which is a semiconductor device composing each of the upper and lower arms is increased, the time in an operation state generating a large amount of heat can be shortened and as a result, the heat per unit time during operation of the inverter can be suppressed. This leads to suppression of the temperature rise of the semiconductor modules 20 and 30 and the thermal effect on the other electrical parts can be suppressed. Further, the operation state generating a large amount of heat is a state that the IGBT 21 which is a semiconductor device is changed from the on state to the off state or is changed from the off state to the on state and particularly, the heat in the state of breaking the current is large.

In the constitution aforementioned, in the first base 11 and second base 12 which are a coolant path structure, the through-holes 1212 and 1112 passing through the housing in the height direction are formed, and the DC terminal of the capacitor 50 and the DC terminals of the semiconductor modules 20 and 30 are connected electrically through the holes, thus the cable of the DC circuit is shortened and the inductance can be reduced.

Further, the DC busbar 40 for connecting the DC terminal of the capacitor 50 and the DC terminals of the semiconductor modules 20 and 30 through the holes 1212 and 1112 formed in the coolant path structure has a laminating structure that the positive and negative busbars are flat and an insulator is held between them. By use of such a structure, the inductance can be reduced.

Furthermore, the laminating structure can be handled easily and is effective in improvement of the productivity.

The power converter of this embodiment is loaded in an automobile, so that it suffers severe vibration and must withstand it. Furthermore, if the power converter is arranged so as to be connected mechanically to the power transfer system or engine of the vehicle, stronger vibration is applied to the vehicle. The conductor for connecting the DC terminal of the capacitor 50 and the DC terminals of the semiconductor modules 20 and 30 has a laminating structure holding an insulator between them and is strong to vibration. Further, due to the structure connected through the holes 1212 and 1112 formed in the coolant path structure, the distance of the connecting wire is short and the structure is little affected by resonance. As mentioned above, this embodiment provides a structure that in addition to reduction in the inductance and improvement of the productivity, the vibration resistance is improved.

Figure 9:
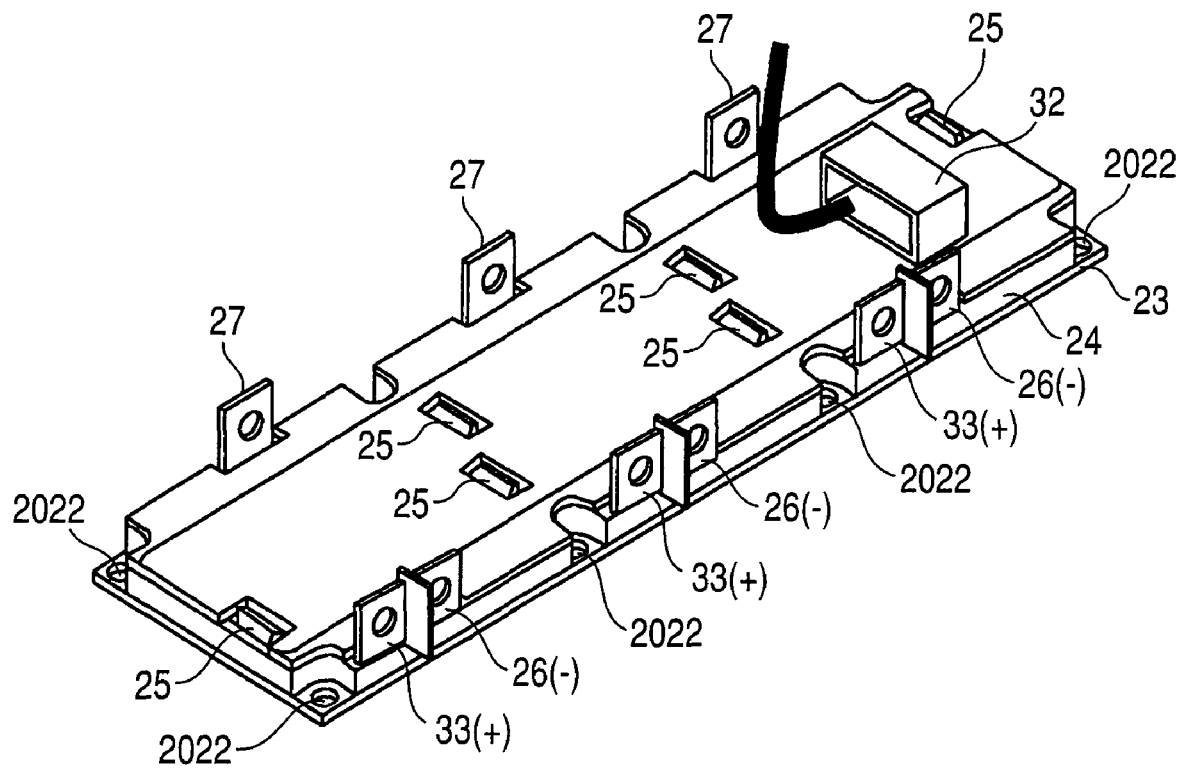
FIG. 9 is a perspective view of the semiconductor module.
Figure 10:
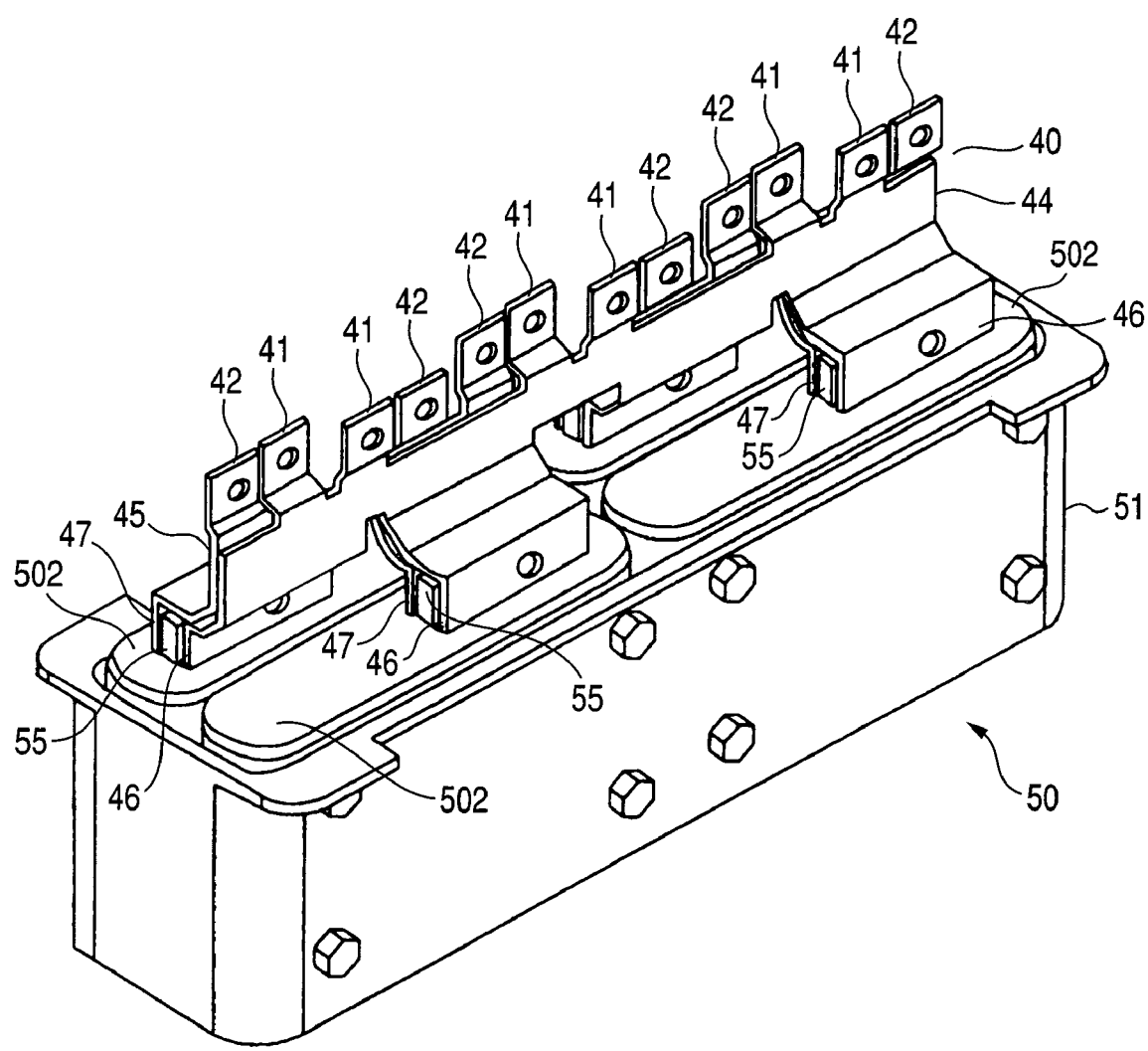
FIG. 10 is a perspective view showing the structures of the capacitor and DC busbar.

In the embodiment shown in FIG. 10, the module terminal 42 of the positive DC busbar 45 of the DC busbar 40, at the position where the positive module DC terminal 33 shown in FIG. 9 is projected upward from the module case 24, extends upward from the upper part of the positive DC busbar 45 and they are in the opposite arrangement relationship. The surfaces make contact with each other in the opposite state and are fixed by a fixing means such as a screw, thus the module terminal 42 of the positive DC busbar 45 is connected electrically to the positive module DC terminal 33.

Further, the module terminal 41 of the negative DC busbar 44 of the DC busbar 40, at the position where the negative module DC terminal 26 is projected upward from the module case 24, extends upward from the upper part of the negative DC busbar 44 and they are in the opposite arrangement relationship. The module terminal 41 of the negative DC busbar 44 faces the negative module DC terminal 26, and both are fixed by a fixing means such as a screw, thus the mutual surfaces make contact with each other and are connected electrically.

The negative capacitor terminal 46 and positive capacitor terminal 47, at the position where the capacitor terminal is projected, extend downward from the lower parts of the negative DC busbar 44 and positive DC busbar 45, hold the capacitor terminal along the short side of the housing opposite to the short side of the housing, and are fixed to the homopolar capacitor terminal by a fixing means such as a screw opposite to the homopolar capacitor terminal, thus are connected electrically to the homopolar capacitor terminal. By use of such a wiring structure, the wiring parts from the positive DC busbar 45 and negative DC busbar 44 to each capacitor terminal can face each other by holding an insulation material between the positive terminal and the negative terminal. By forming such a laminating structure, the inductance of the circuit can be reduced. By doing this, the switching operation of the IGBT 21 can be speeded up and the heat generation due to the power loss during switching can be suppressed.

At the end of the other side of the housing along the long sides, that is, on the opposite side which is a different side from the side where the inlet 15 and outlet 16 are installed, a DC terminal 80 is installed. The DC terminal 80 includes a positive DC external terminal 82, a negative DC external terminal 81, a positive DC connecting terminal 86, a negative DC connecting terminal 85, a positive DC busbar 84 for connecting the positive DC external terminal 82 and positive DC connecting terminal 86, and a negative DC busbar 83 for connecting the negative DC external terminal 81 and negative DC connecting terminal 85.

Figure 5:
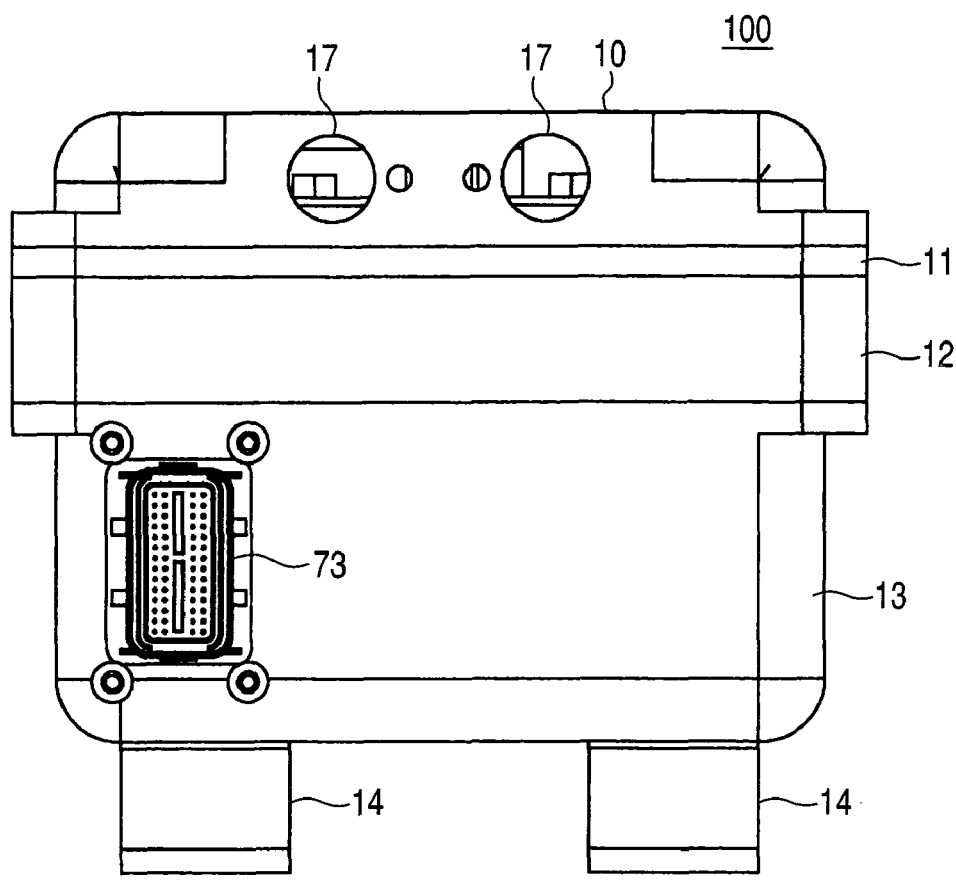
FIG. 5 is a right side view of the power converter 100.
Figure 6:
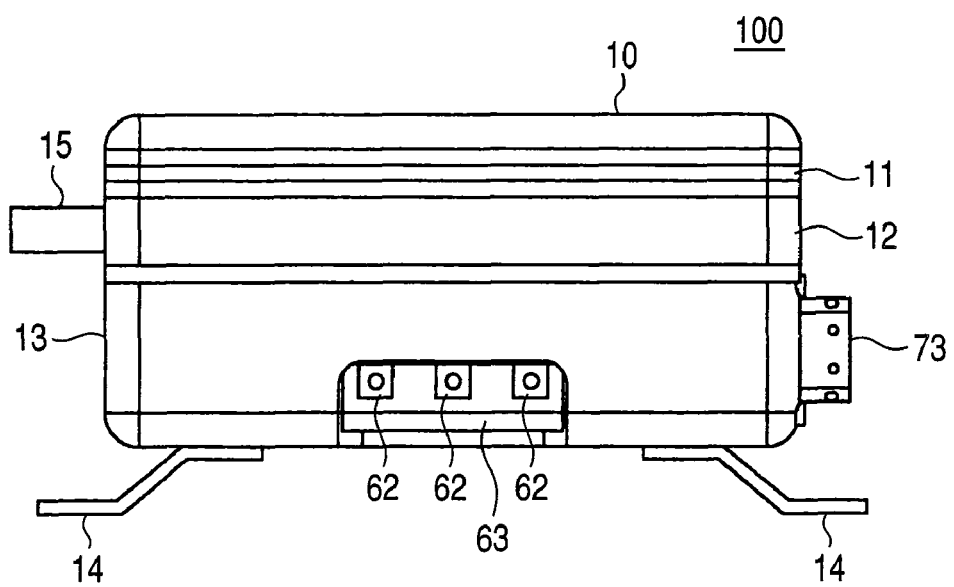
FIG. 6 is a front view of the power converter 100.
Figure 7:
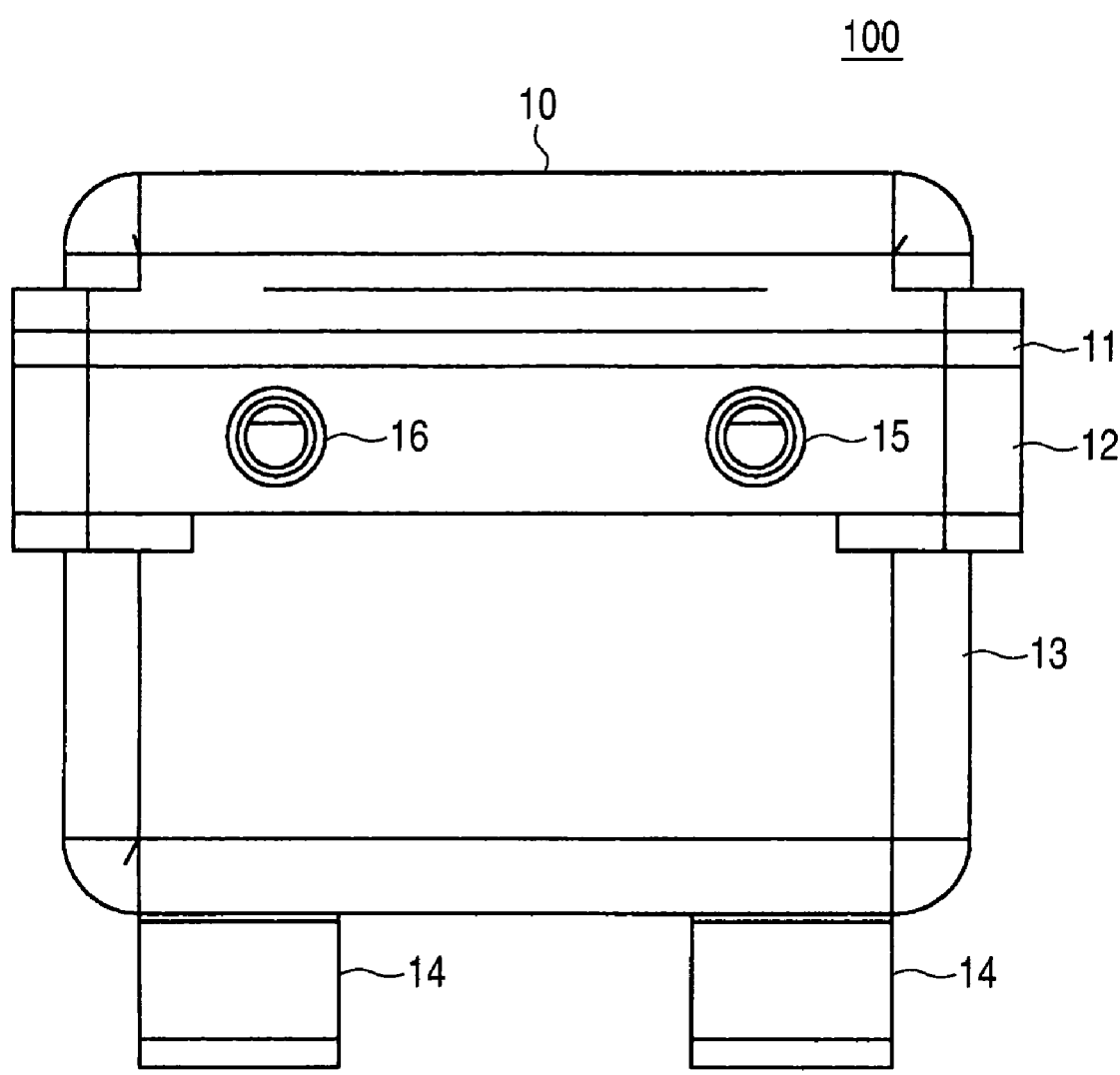
FIG. 7 is a left side view of the power converter 100.
Figure 8:
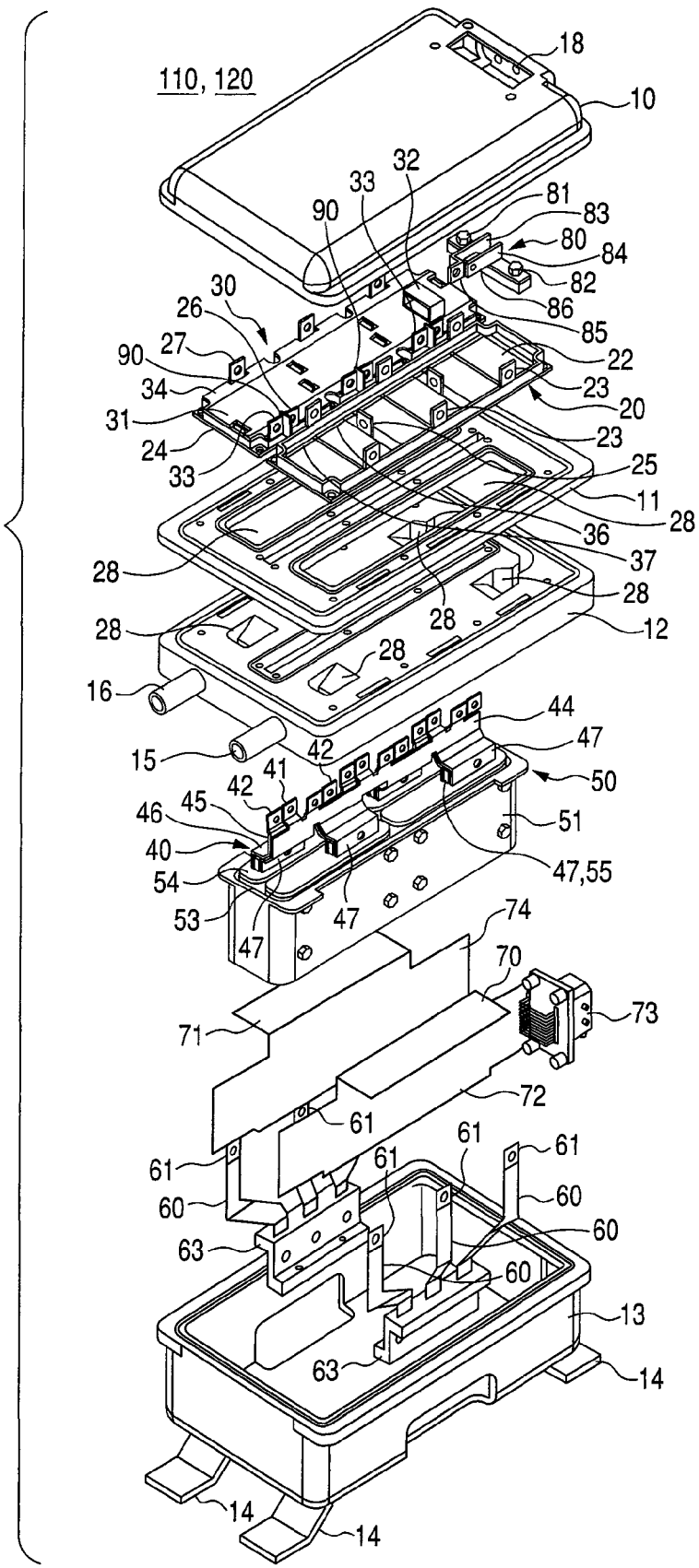
FIG. 8 is an exploded perspective view showing the constitution of the power converter 100.

The positive DC external terminal 82 and negative DC external terminal 81 are connected electrically to an external cable extending via a connector mounted in a through-hole 17 formed in the end face on the other side of the housing along the long sides thereof shown in FIG. 5. The positive DC busbar 84 and negative DC busbar 83 are arranged so that the surfaces thereof are opposite to each other along the short sides of the housing. By such an opposite arrangement, the busbars extend toward the semiconductor modules 20 and 30. The positive DC connecting terminal 86 is connected electrically to the positive module DC terminal 33 of the semiconductor modules 20 and 30 and the module terminal 42 of the DC busbar 40 and the negative DC connecting terminal 85 is connected electrically to the negative module DC terminal 26 of the semiconductor modules 20 and 30 and the module terminal 41 of the DC busbar 40. A hole 18 formed in the top of the upper housing 10 shown in FIG. 8 is an opening for performing a connection operation of the positive DC external terminal 82 and negative DC external terminal 81 to an external cable and is sealed by a cover when the apparatus is not in operation.

By use of such a structure, an effect such that the inductance of the DC circuit can be reduced is obtained. Further, the negative and positive DC busbars 44 and 45 for flowing a large current are fixed along the long sides of the holes 1212 and 1112 penetrating the first base 11 and second base 12 and an effect of suppressing the amplitude of vibration is obtained. Further, the DC terminal 80 connected to the negative and positive DC busbars 44 and 45 is fixed to the first base 11 forming a coolant path structure, so that an effect of cooling efficiently the heat generated due to a large current flowing in the busbars is obtained.

Figure 12:
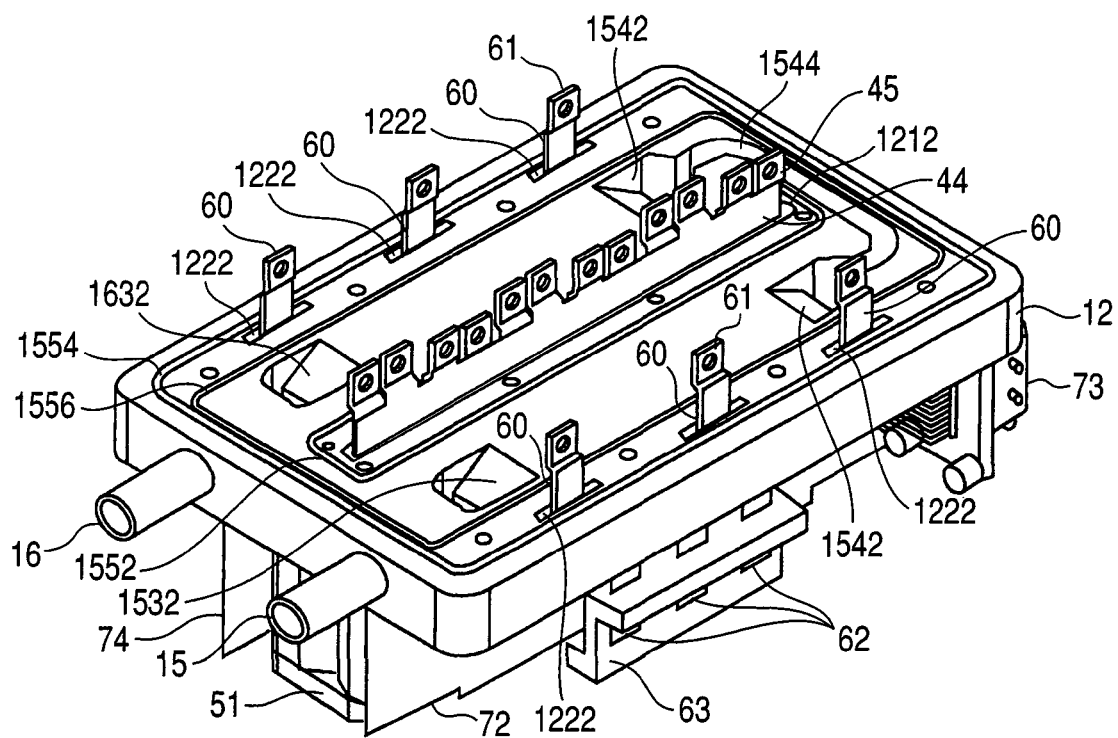
FIG. 12 is an exploded perspective view showing the internal structure of the power converter 100.
Figure 13:
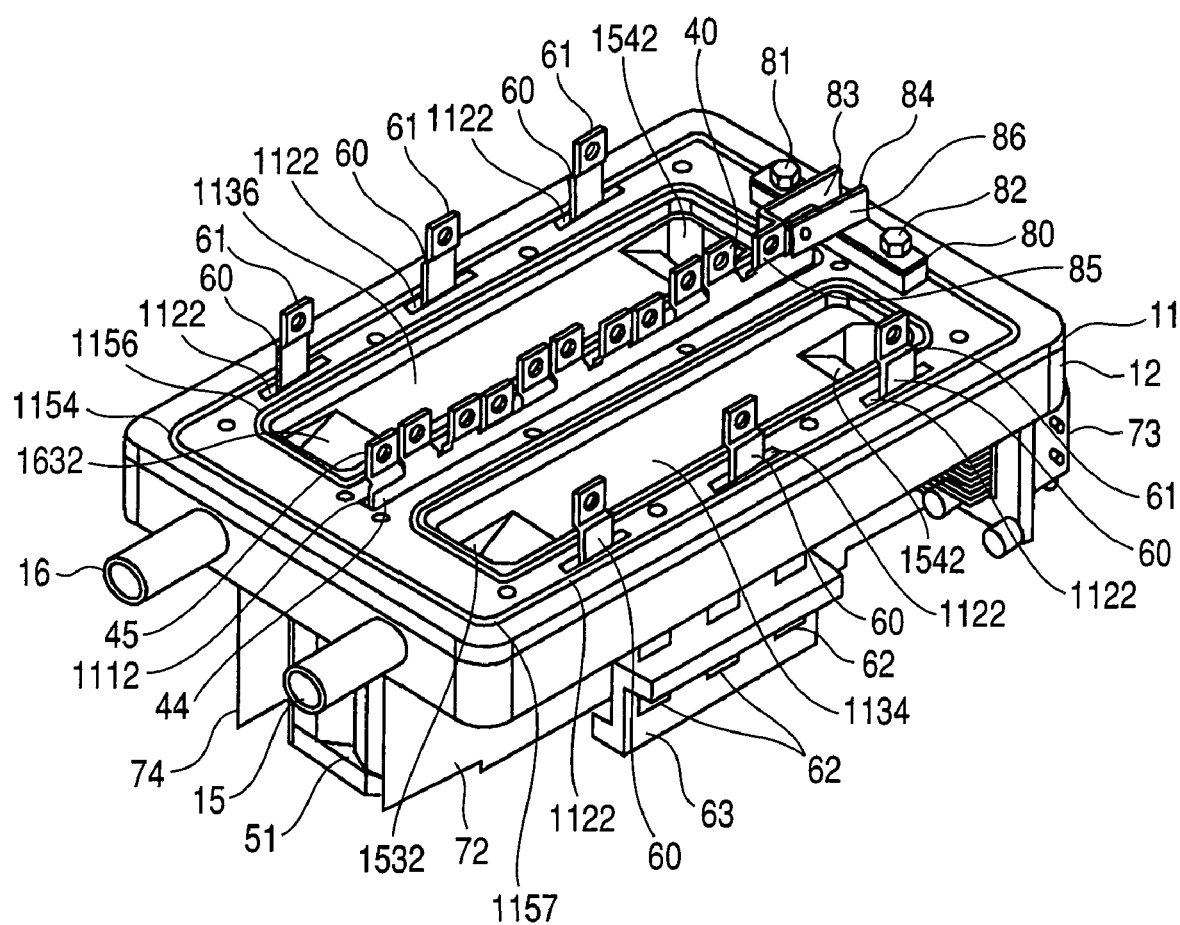
FIG. 13 is an exploded perspective view showing the internal structure of the power converter 100.

AC busbars 60 for letting a 3-phase alternating current flow are arranged along the coolant path of the housing. The AC busbars 60 are installed on the metal parts outside the coolant paths of the first base 11 and second base 12 along the coolant paths. As shown in FIGS. 12 and 13, the AC busbars 60 for letting a current of each phase flow extend toward the module AC terminals 27 of the semiconductor modules 20 and 30 from a terminal holder 63 via a hole 1222, formed in the second base 12, penetrating the second base 12 and via a hole 1122, formed in the first base 11, penetrating the first base 11.

At one end of the AC busbar 60 in the upper cooling chamber, a module AC terminal 61 is formed, faces the short sides of the housing opposite to the module AC terminal 27, is fixed to the module AC terminal 27 by a fixing means such as a screw, thereby is connected electrically to the module AC terminal 27. At the other end of the AC busbar 60 in the lower cooling chamber, output terminals 62 for connecting with an external cable to supply power to the module generator 130 or 140 is formed and is held by the terminal holder 63. The output terminals 62 act as an AC power terminal.

Further, in the power converter 100, feet 14 for fixing to the housing of the transmission 105 or the housing of the engine 104 and transmission 105 are installed and the feet 14 use a rigid body such as SUS to endure the intensity thereof. Further, the feet 14 are formed in the bend structure so as to suppress vibration from the transmission 105 and engine 104 in order to keep the elasticity.

FIG. 9 shows an external view of the semiconductor modules 20 and 30. As explained previously, each semiconductor module is internally divided into three storage chambers and in each storage chamber, the IGBT 21 and diode 38 composing upper and lower arms of each of the three phases are mounted. Namely, the upper and lower arms of each of the three phases have respectively three sets of IGBTs 21 and diodes 38 connected in parallel. The upper and lower arms form series circuits connected in series and the connection points of the upper and lower arms are connected respectively to the module AC terminal 27. The series circuits correspond to each of the three phases and a DC current is supplied to the series circuits.

In FIG. 9, the cooling plate 23 of the semiconductor module 20 or 30 is almost rectangular, and on one surface thereof not drawn in FIG. 9, cooling fins are installed, and on the other surface thereof, the module case 24 for storing the chips of the IGBT 21 and diode 38 composing each arm aforementioned is installed. On one of the long sides of the almost rectangle of the cooling plate 23, the module AC terminal 27 is arranged and on the other one of the long sides of the almost rectangle, three sets of the positive module DC terminal 33 and negative module DC terminal 26 for supplying DC power to each series circuit aforementioned are arranged. The positive module DC terminal 33 and negative module DC terminal 26 of each set supply respectively DC power to the series circuits. A control signal for permitting the IGBT 21 composing each of the upper and lower arms to perform the switching operation is supplied from the connector 25.

In the cooling plate 23, a screw hole 2022 for fixing the cooling plate 23 to the first base which is a coolant path structure with a screw is formed. At the part of the screw hole 2022, the module case 24 is formed in a crater shape. The cooling fins provided on one surface of the cooling plate 23 are projected into the coolant path and the opening of the coolant path for the projection must be sealed by one surface of the cooling plate 23. It is necessary to prevent the engine coolant from leaking from the opening and it is necessary to hold a seal material between the cooling plate 23 and the circumference of the opening of the first base and tighten strongly the seal material by the cooling plate 23 and first base. As a seal material, a soft metal such as copper, an O-ring, resin, or rubber may be considered. The module case 24 is made of resin, thereby is not suited to be tightened strongly, so that a structure is desirable that the module case 24 is hollowed, and a screw hole is formed in the cooling plate 23, and the cooling plate 23 is tightened directly by a screw.

Figure 3:
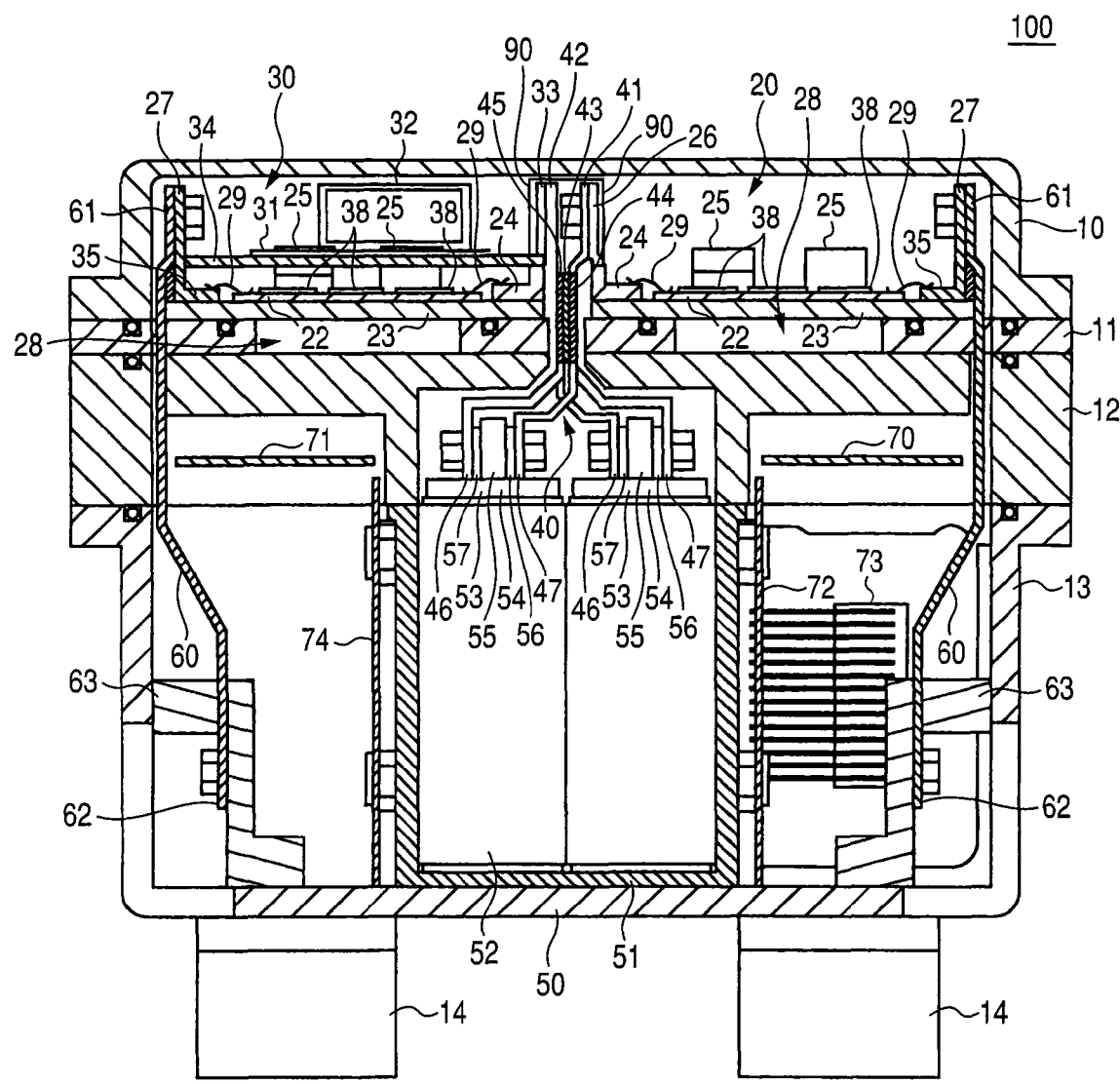
FIG. 3 is a cross sectional view for explaining the structure of the power converter 100.

FIG. 10 is a drawing showing the capacitor 50 and DC busbar 40 which are shown in FIGS. 3 and 8. In this embodiment, four unit capacitors 502 are fixed by the capacitor case 51 and are fixed in the housing so that the upper flange of the capacitor case 51 makes contact with the bottom of the second base. On each of the unit capacitors 502, an insulation material 55 is installed, and on one of the surfaces of the insulation material 55, the negative capacitor terminal 56 is installed and on the other surface of the insulation material 55, the positive capacitor terminal 57 is installed. The negative capacitor terminal 56 and positive capacitor terminal 57 are smaller than the surface of the insulation material 55, so that they are not shown in FIG. 10.

The DC busbar 40 forms a laminating structure having the negative DC busbar 44 and positive DC busbar 45 across the insulation sheet. The negative DC busbar 44 has the negative capacitor terminals 46 and in FIG. 10, between the negative capacitor terminals 46 and the insulation materials 55, the negative capacitor terminals 56 of the capacitor are arranged respectively. Further, the positive DC busbar 45 has the positive capacitor terminals 47 and between the positive capacitor terminals 47 of the positive DC busbar 45 and the insulation materials 55, the positive capacitor terminals 57 of the capacitor are arranged respectively. The negative DC busbar 44 has additionally a plurality of module terminals 41 and the module terminals 41 are connected respectively to the negative module DC terminals 26 of the semiconductor modules 20 and 30. The positive DC busbar 45 has a plurality of module terminals 42 and the module terminals 42 are connected respectively to the positive module DC terminals 33 of the semiconductor modules 20 and 30. In FIG. 10, to avoid complication of the drawing, for the negative capacitor terminals 46 and positive capacitor terminals 47, numerals are assigned respectively to only one place and the other places are not shown.

As shown in FIGS. 4 and 8, the semiconductor modules 20 and 30 are arranged so that the negative and positive module DC terminals 26 and 33 approach mutually, thus the DC busbar 40 having a laminating structure can connect the terminals of the semiconductor modules 20 and 30 and capacitor 50 and a structure of simple wiring is obtained.

The aforementioned laminating structure is simplified, so that as shown in FIGS. 3 and 8, a through-hole is formed in the first base and second base which are a coolant path structure for forming a coolant path and the busbar having the laminating structure is arranged in the through-hole, thus the wiring distance between the semiconductor modules 20 and 30 and the capacitor 50 is shortened, and the electric resistance of the circuit is reduced. Further, the overall wiring structure is simplified and the productivity during production is improved. The laminating structure realizing a short wiring distance is obtained, so that the inductance of the electric circuit is reduced.

In FIG. 10, the capacitor case 51 is equipped with a flange, and the capacitor case 51 and flange are made of a thermally conductive metal, and the flange makes contact with the surface of the second base which is a coolant path structure, so that the cooling effect of the capacitor case 51 is improved. The capacitor case 51 makes contact with the cell of each of the unit capacitors 502, so that it functions so as to discharge heat from the cell with a large area to the coolant path structure, thus the cooling effect is increased.

The cell of each of the unit capacitors 502 is fixed by the capacitor case 51 made of a metal material such as aluminum, so that the structure is strong not only to cooling but also to vibration.

In this embodiment, the power converter is surrounded throughout the circumference by the housing made of a thermally conductive material, and a plurality of chambers are formed in the housing, and the semiconductor modules 20 and 30 are arranged in one chamber, so that the semiconductor modules 20 and 30 can be cooled efficiently. Therefore, an effect that the semiconductor modules 20 and 30 can be made comparatively compact is obtained. Further, the fins are arranged in a coolant, so that the cooling effect is improved more. Therefore, the engine coolant can be used without using an exclusive coolant and the entire hybrid system of a vehicle can be made compact and light in weight.

The semiconductor modules 20 and 30 are arranged in one of the plurality of chambers and the capacitor is arranged in a different chamber, so that the capacitor is hardly affected by heat generation of the IGBT 21 and the reliability of the power converter is improved.

Figure 11:
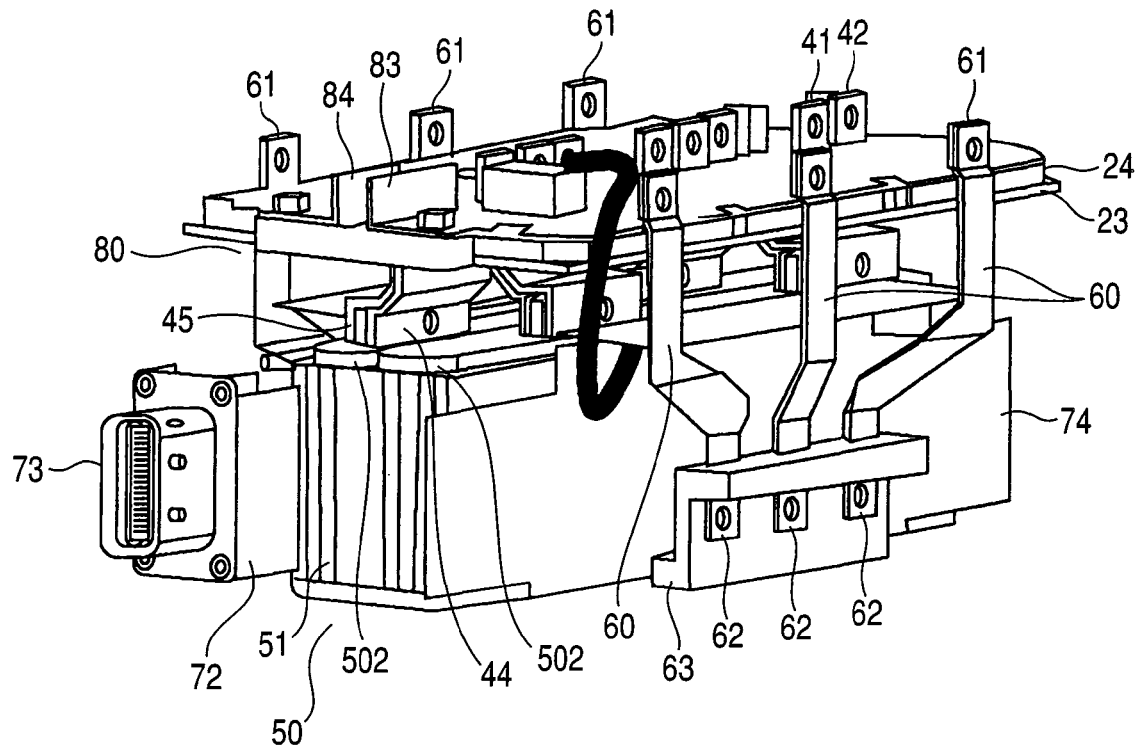
FIG. 11 is a perspective view showing the connection state of the capacitor and semiconductor module.

FIG. 11 is a drawing showing the connection state of the capacitor 50 and semiconductor modules 20 and 30 using the DC busbar and arrangement of the AC busbars 60. Actually, between the capacitor 50 and the semiconductor modules 20 and 30, there exist the first base 11 and second base 12 composing the coolant path structure. The drawing, for easy understanding of the connection relationship of the DC busbars, shows the state that the first base 11 and second base 12 composing the coolant path structure are removed. The DC busbars form a laminating structure that the negative DC busbar 44 and positive DC busbar 45 hold an insulation sheet between them. By this laminating structure, the magnetic fluxes of the negative and positive DC busbar 44 and 45 are canceled each other and the inductance of the circuit is reduced. The DC busbar forming the laminating structure is positioned at the central position of the apparatus and the capacitor 50 and semiconductor modules 20 and 30 are connected at the central position. Further, an AC current generated by the semiconductor modules 20 and 30 is outputted from the side of the apparatus. The connection end with another device of a three-phase alternating current is shown as an output terminal 62.

To the DC terminal 80, a DC current at 100 V or higher, for example, 300 V is supplied externally and via the negative DC busbar 83 and positive DC busbar 84, is supplied to the DC terminals of the semiconductor modules 20 and 30. In this apparatus, DC power is supplied from the upper part of the apparatus and is converted to AC power by the semiconductor modules 20 and 30 arranged on the upper part thereof. The converted AC power is outputted from the AC terminals of the semiconductor modules 20 and 30 positioned on the side of the apparatus and the AC power is led to the output terminal 62 through three sets of the AC busbars 60. Each of the AC busbars 60 corresponds to one of the three phases of the AC power. The three sets of the AC busbars 60 are arranged respectively on both sides of the apparatus and can supply simultaneously the AC power to two rotary electric machines.

In the structure aforementioned, the DC terminal 80 for transmitting and receiving DC power is installed in one of the up and down directions and the output terminal 62 for transmitting and receiving AC power is arranged in the other direction. The DC terminal 80 and the output terminal 62 for transmitting and receiving AC power are arranged in different positions like this, so that the cables in the apparatus are laid in good order and an effect led to improvement of reliability is obtained.

In the above explanation, the two rotary electric machines are all used as a motor, though the rotary electric machines are operated not only as a motor but also as a generator. When each rotary electric machine is operated as a generator, the AC power generated by the rotary electric machine is led from the output terminal 62 into the apparatus, is led to the AC terminals of the semiconductor modules 20 and 30 via the AC busbars 60, is converted to DC power by the semiconductor modules 20 and 30, is supplied from the DC terminals of the semiconductor modules 20 and 30 to the DC terminal 80, and is outputted from the apparatus. The outputted DC power is supplied to the battery 106 shown in FIG. 1.

A plurality of unit capacitors, in this embodiment, four unit capacitors are held in the capacitor case 51 and outside the capacitor case 51, the connector board 72 and control circuit board 74 are installed. As mentioned above, from each unit capacitor, the negative capacitor terminal and positive capacitor terminal are projected, and the negative capacitor terminal 56 and positive capacitor terminal 57 are connected respectively to the negative DC busbar 44 and positive DC busbar 45, and the module terminal 41 of the negative DC busbar 44 and the module terminal 42 of the positive DC busbar 45 are connected respectively to the negative module DC terminal 26 and positive module DC terminal 33 of the semiconductor modules 20 and 30.

As mentioned above, the semiconductor modules 20 and 30 have respectively the module AC terminals 27 of the phases U, V, and W on the opposite side of the DC terminals and to the terminals, the module AC terminals 61 of the AC busbars 60 made of a copper metal having a rectangular section are connected. The opposite ends of the AC busbars 60 are used as an output terminal 62. The output terminal 62 has a structure of penetrating and projecting from the terminal holder 63 and is fixed by the terminal holder 63. The output terminal 62 has a screwing hole and is connected to a power supply cable for supplying AC power to the stator of the rotary electric machine. Further, in FIG. 11, the first base 11 and second base 12 composing the coolant path structure are omitted as mentioned above, though in the first base 11 and second base 12, as shown in FIGS. 12 and 13, there are holes for letting the AC busbars 60 pass through formed.

As shown in FIGS. 4 and 11, the AC busbars 60 are arranged so as to pass outside the semiconductor modules 20 and 30 arranged in parallel and on the other hand, the negative DC busbar 44 and positive DC busbar 45 are arranged so as to pass outside the semiconductor modules 20 and 30, so that the semiconductor modules, capacitor, AC busbars 60, negative DC busbar 44, and positive DC busbar 45 can be stored in a comparatively small volume, thus the power converter can be made comparatively compact.

Further, as mentioned above, the AC busbars 60 are arranged so as to pass outside the semiconductor modules 20 and 30 arranged in parallel and on the other hand, the negative DC busbar 44 and positive DC busbar 45 are arranged so as to pass outside the semiconductor modules 20 and 30, so that the terminals and cables of the components arranged in the power converter on the DC side and the terminals of the components on the AC side are arranged separately from each other, thus an effect of easy design is obtained. Further, along the flow of a coolant, the DC terminals and AC terminals are arranged opposite to each other, thus the circuits for converting DC to AC can be arranged regularly between the facing terminals, and as a result, an effect of making the power converter compact is obtained. Further, the circuits for converting DC to AC can be arranged regularly, so that the cooling effect is improved. Furthermore, satisfactory electric characteristics can be obtained easily and the reliability is improved.

In this embodiment, one end 61 of each of the AC busbars 60 is fixed to the module AC terminal 27 of the semiconductor module, and the other end is fixed to the terminal holder 63, and the AC busbar 60 can be formed integrally with the terminal 61 and the terminal 27. Therefore, the AC busbars 60 have a simple structure and can be produced easily. Further, for vibration from the outside when the power converter is arranged in an environment causing much vibration, the structure for fixing the AC bubars 60 has a characteristic strong to vibration. The terminal 62 acts as an AC power terminal.

The DC terminal 80 is located in the neighborhood of the semiconductor modules 20 and 30 and is arranged in the neighborhood of the upper housing 10 of the power converter, and on the other hand, the output terminal 62 is arranged in the neighborhood of the lower housing 13. When the output terminal 62 for supplying a 3-phase AC current to the rotary electric machine is arranged in the neighborhood of the rotary electric machine, the DC terminal 80 is positioned away from the rotary electric machine and the DC circuit and components relating to the DC circuit can be arranged separately from the AC circuit. By doing this, the internal arrangement of the power converter becomes regular, and the entire apparatus is miniaturized, and moreover the reliability is improved. As shown in FIG. 11, the relationship between the upper and lower parts of the apparatus and relationship between the central part and both sides thereof are well-regulated. This arrangement makes the entire apparatus compact and improves the reliability.

FIG. 12 shows the second base 12 composing the coolant path structure and FIG. 13 shows the first base 11 composing the coolant path structure. In FIG. 12, a coolant is led to the second base 12 from the inlet 15. In this embodiment, the engine coolant is fed from the inlet 15. The aforementioned coolant flows into an inlet chamber 1532, passes through the coolant path formed in the first base 11, and is led to a connection chamber 1542. The coolant is led from the connection chamber 1542 to the neighboring connection chamber 1542 via a channel 1544, passes through the coolant path formed in the first base 11 from the connection chamber 1542, and is led to an outlet chamber 1632. The coolant led to the outlet chamber 1632 is discharged from the outlet 16.

In the second base 12, ditches for seal 1552, 1554, and 1556 are formed and into the ditches for seal, seal materials made of a soft metal such as copper or resin are fit. The seal materials are fit into the ditches for seal 1552, 1554, and 1556 and the surfaces of the first base 11 and second base 12 are pressed to each other by applying pressure, thus the coolant can be prevented from leakage.

The hole 1212 is formed in the center of the second base 12 and from the hole, the DC busbar 40 of the laminating structure composed of the negative DC busbar 44 and positive DC busbar 45 holding an insulation sheet between them is projected. The DC busbar is surrounded by the ditch for seal 1552 and is structured so as to prevent coolant leakage. Further, on the sides of the second base 12, the holes 1222 for letting the AC busbars 60 pass through are formed and from the respective holes 1222, the AC busbars 60 are projected. The through-hole 1222 of each of the AC busbars 60 is held between the ditches for seal 1554 and 1556 and is protected from entry of a coolant. Entry of a coolant from the outside is prevented by the ditch for seal 1554 and entry of a coolant from the inner coolant path is prevented by the ditch for seal 1556.

FIG. 13 is a drawing for explaining the first base 11 composing the coolant path structure and in the drawing, onto the top of the second base 12 shown in FIG. 12, the first base 11 is pressurized by a fixing means such as a screw via a seal material. In the center of the first base 11, the hole 1112 is formed and via the hole 1112, the DC busbar 40 of the laminating structure composed of the negative DC busbar 44 and positive DC busbar 45 holding an insulation sheet between them is projected. Further, on both sides of the hole 1112, an opening 1134 and an opening 1136 are formed.

The coolant led from the inlet 15 of the second base 12 flows into an inlet chamber 1532 of the second base 12, passes through the opening 1134 which is a coolant path formed in the first base 11, and is led to the connection chamber 1542 of the second base 12. The coolant in the connection chamber 1542 of the second base 12 is led to the connection chamber 1542 of the second base 12, passes through the opening 1136 which is a coolant path formed in the first base 11 from the connection chamber 1542, and is led to an outlet chamber 1632 of the second base 12. The coolant of the outlet chamber 1632 is discharged from the outlet 16.

To the opening 1134 formed in the first base 11, the semiconductor module 20 is fixed and to the opening 1136, the semiconductor module 30 is fixed. The cooling fins of the semiconductor modules 20 and 30 are projected into the coolant paths from the openings aforementioned and the respective openings are sealed by the cooling plates of the semiconductor modules 20 and 30. Around the opening 1134, a ditch for seal 1157 is formed and around the opening 1136, the ditch for seal 1156 is formed. Into the ditches for seal 1157 and 1156, seal materials made of a soft metal such as copper or seal materials made of resin or rubber are fit and as mentioned above, the cooling plates of the semiconductor modules 20 and 30 are pressurized, thus the openings are sealed. To tighten the cooling plates of the semiconductor modules 20 and 30, screws are used. Outside the openings 1134 and 1136, the holes 1122 are formed and the AC busbars 60 are projected via the hole 1222 of the second base 12 and the hole 1122 of the first base 11. The ends of the projected AC busbars 60 are connected to the module AC terminals 27 of the semiconductor modules 20 and 30.

Outside the hole 1122 of the first base 11 through which the AC busbar 60 passes, a ditch for seal 1154 is formed and into the ditch for seal 1154, a seal material made of a soft metal such as copper or a seal material made of resin or rubber is fit, and the upper housing 10 is pressurized, thus a coolant can be prevented from leakage and entry in the hole 1122 of the first base 11 from the outside.

On the different side from the gateway of a coolant, on the opposite side in this embodiment, the DC terminal 80 is arranged, and supply of power and feed of a coolant are separated very regularly, so that the reliability is improved. Further, the connection of AC power is at a position different in height and a coolant, DC power, and AC power are arranged at different positions from each other, so that the reliability is improved. Further, the mounting operation of the power converter is easy. Further, the connector 73 for connecting a signal line for transmitting and receiving data and an instruction is installed on the bottom of the same housing as that of the output terminal for transmitting and receiving the AC power and for example, an effect that the laying operation of a cable for receiving the condition of the rotary electric machine from a sensor installed on the rotary electric machine can be performed easily is obtained. Further, an effect that the cabling between the power converter and the rotary electric machine is not complicated and is executed easily is obtained. Furthermore, the tool and direction relating to feed and discharge of a coolant are different, so that the usability of the space when the power converter is loaded in a vehicle is excellent and effect of improvement of reliability is obtained.

The structure aforementioned has an excellent effect in productivity and maintenance. Namely, the central space of the housing is interrupted by the first base 11 or second base 12 and on the upper parts of the first base 11 and second base 12, the semiconductor modules 20 and 30 are arranged. Even if a miniature part such as an electronic part relating to the semiconductor modules 20 and 30 or a screw for fixing the part drops at the manufacture step or during the maintenance operation, it will not drop in the lower space from the first base 11 or second base 12 and can be picked up easily. Compared with a conventional mobile device such as engine control equipment, the voltage relating to the power converter is high such as several hundreds volts and a vehicle suffers severe vibration, so that if a piece of metal such as a screw drops inside the power converter, a large accident is caused. In the structure aforementioned, when the first base 11 or second base 12 is fixed once to the housing, the space connected once to the chamber under the first base 11 or second base 12 is only the holes 1112, 1122, 1212, and 1222, and in these holes, the DC busbars 40 and AC busbars 60 are arranged, and there is no space where a small part such as a screw drops. Therefore, an effect that when a small part such as a screw drops, the trouble of removing a fixed part and picking up the dropped part can be saved is obtained.

Figure 14:
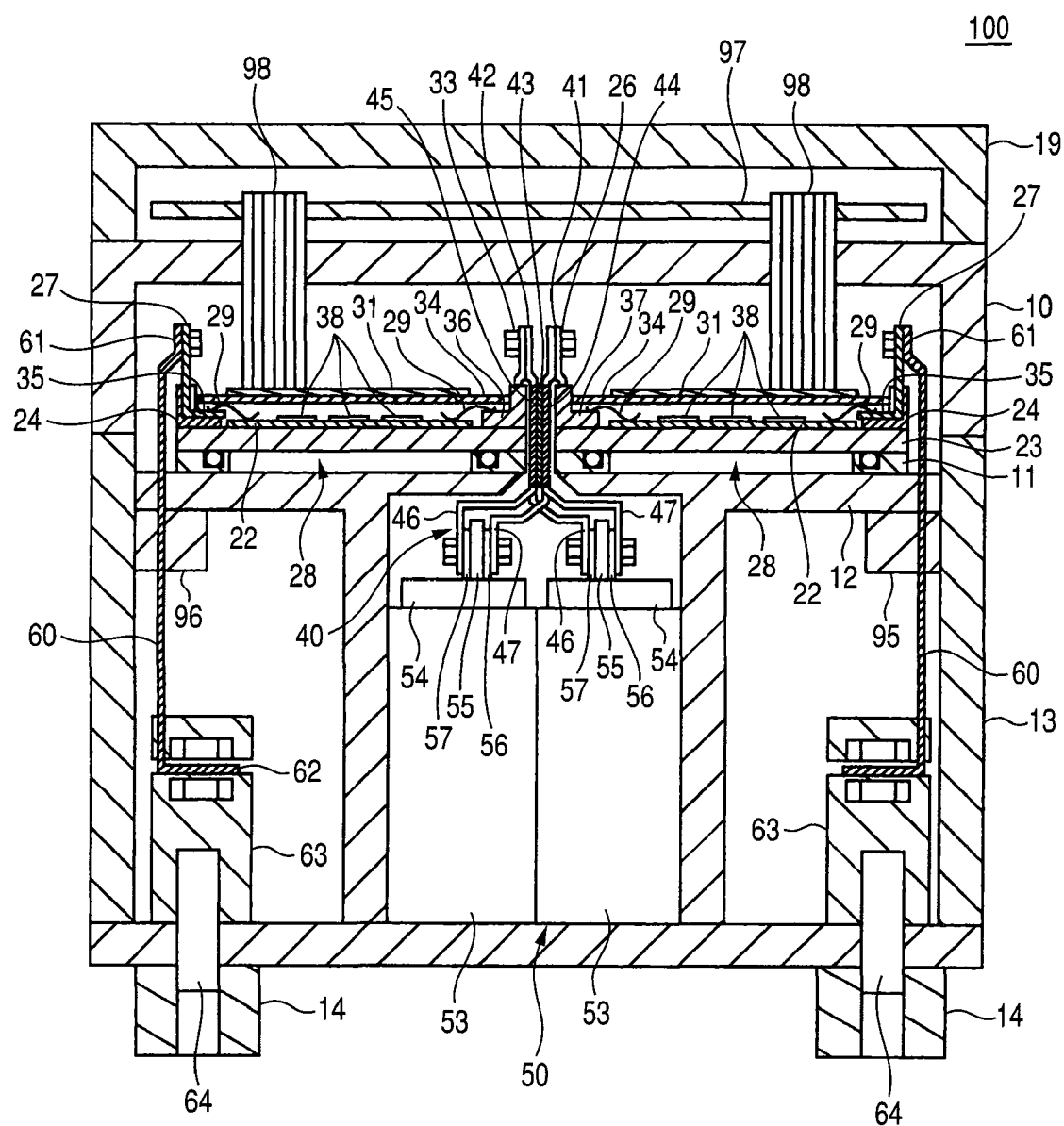
FIG. 14 is a cross sectional view showing another embodiment relating to the power converter 100.

The power converter shown in FIG. 14 is an embodiment in which the shape of the first base 11 is changed slightly and the same numerals have the same structure and function as those aforementioned. In this embodiment, on the upper parts of the chambers where the semiconductor modules 20 and 30 are stored, the third cooling chamber surrounded by the upper housing 10 and second upper housing 19 throughout the entire periphery is formed and therein, a board 97 in which the drive circuit board, control circuit board, and connector board are merged is stored. The wiring board 31 arranged on the tops of the semiconductor modules 20 and 30 and the board 97 are connected electrically with a signal cable 98.

The capacitor 50 composed of a plurality of unit capacitors, as mentioned above, is arranged at the opposite position of the semiconductor modules 20 and 30 across the coolant path and has no capacitor case. The second base 12 has the π-shaped legs and is stored between the legs, so that it is structured so as to use no thermally conductive capacitor case. In this embodiment, the π-shaped legs of the second base 12 are structured so as to extend up to the bottom of the lower housing 13.

In FIG. 14, the sides of the first base 11 are shortened and the base is shaped so as to provide a gap between the sides and the inner surface of the lower housing 13. The AC busbars 60 are arranged through the gap and the hole 1122 of the embodiment aforementioned is not necessary. In the AC busbars 60, current sensors 95 and 96 are installed and these sensors are held by the thermally conductive lower housing 13.

The feet 14 of the power converter have a hollow structure, and power cables 64 connected electrically to the output terminals 62 pass through them and are led into the housing of the transmission 105. By use of such a structure, the power cables 64 are led easily into the housing of the transmission 105 and can be connected to the motor generators 130 and 140. The cables can be prevented from complication and the problem that the cables are damaged due to vibration caused to the cables for a long period of time can be reduced.

In this embodiment, similarly to the aforementioned embodiment, the effect of generation of heat of the IGBT 21 on the capacitor 50 can be suppressed low.

The embodiment modifying the arrangement of the capacitor 50 explained in the aforementioned embodiment will be explained by referring to FIG. 15. Further, the same numerals as those described above indicate the same parts, same structures, or same functions. The difference from the aforementioned embodiment is the respect that in the cooling chambers where the semiconductor modules 20 and 30 are stored, the drive circuit boards 70 and 71, the AC busbars 60, and the terminal holder 63 are stored. Further, under the cooling chambers where the semiconductor modules 20 and 30 are stored, a second cooling chamber is formed by the second base 12 and furthermore, under it, two third cooling chambers are formed by the second base 12. In the second cooling chamber, the capacitor 50 is arranged, and in one of the third cooling chambers, the control circuit board 74 is arranged, and in the other one of the third cooling chambers, the connector board 72 is arranged.

The capacitor 50 is turned sideways and is separated and stored into two along the short sides of the housing. Therefore, the DC busbar 40 is also structured so as to separate on the side of the semiconductor module 20 and the side of the semiconductor module 30. Further, the constitution of the DC busbar 40 is similar to that of the first embodiment, though the bending way of each terminal is changed partially. Further, in the DC busbar 40, the positive DC external terminal 82 and negative DC external terminal 81 are formed integrally. Further, numeral 99 indicates a connector cable for connecting electrically the drive circuit boards 70 and 71 to the wiring board 31.

In this constitution, the length in the height direction is made shorter and a structure strong to vibration of a vehicle is obtained. As mentioned above, the AC busbars 60 are arranged in the neighborhood of the outside of the apparatus, and the DC circuit is arranged in the neighborhood of the center of the apparatus between the two cooling paths, so that the cables and components are arranged regularly and an effect of making the apparatus comparatively compact is obtained. Further, the AC cables and DC cables are arranged separately from each other, so that the reliability is improved.

Similarly to the aforementioned embodiment, the thermal effect of generation of heat of the IGBT 21 on the other components such as the capacitor 50 can be suppressed low.

Another embodiment of the present invention will be explained by referring to FIG. 16. The same numerals as those of the aforementioned embodiment indicate the same parts and same constitutions and the explanation will be omitted. The difference of this embodiment from the aforementioned embodiment is the respect that the power converter aforementioned has ability of driving two rotary electric machines, while this embodiment is a power converter for driving one rotary electric machine.

Figure 15:
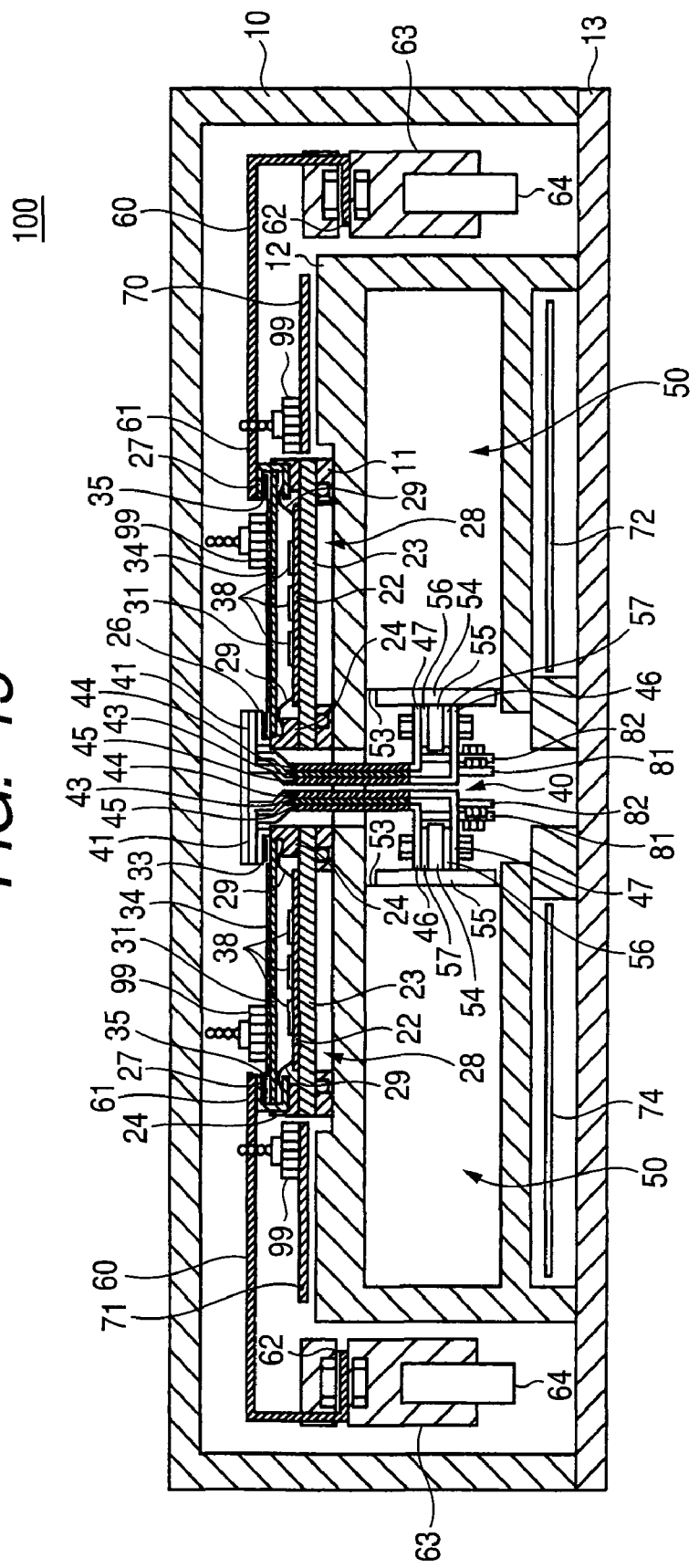
FIG. 15 is a cross sectional view showing still another embodiment relating to the power converter 100.

The constitution of the power converter 100 is close to the constitution of the left half side obtained by cutting the housing at the center along the short side in the apparatus shown in FIG. 15. On the upper part of the cooling chamber storing the semiconductor module 30, the cooling chamber is formed and therein, the board 97 in which the drive circuit board, control circuit board, and connector board is merged is arranged. The power cables 64, as explained in FIG. 14, are structured so as to be led into the housing of the transmission 105 via the hollow-structured feet 14.

Further, as a constitution of a power converter corresponding to one rotary electric machine, the constitution of the left half or right half obtained by cutting the power converter shown in FIGS. 2 to 13 at the center of the housing along the short side may be used. Further, the left half or right half constitution obtained by cutting the power converter shown in FIGS. 14, 15, and 16 at the center of the housing along the short side may be used.

Also in this embodiment, the thermal effect of heat radiation from the semiconductor modules 20 and 30 on the capacitor 50 and other components can be suppressed low.

Figure 16:
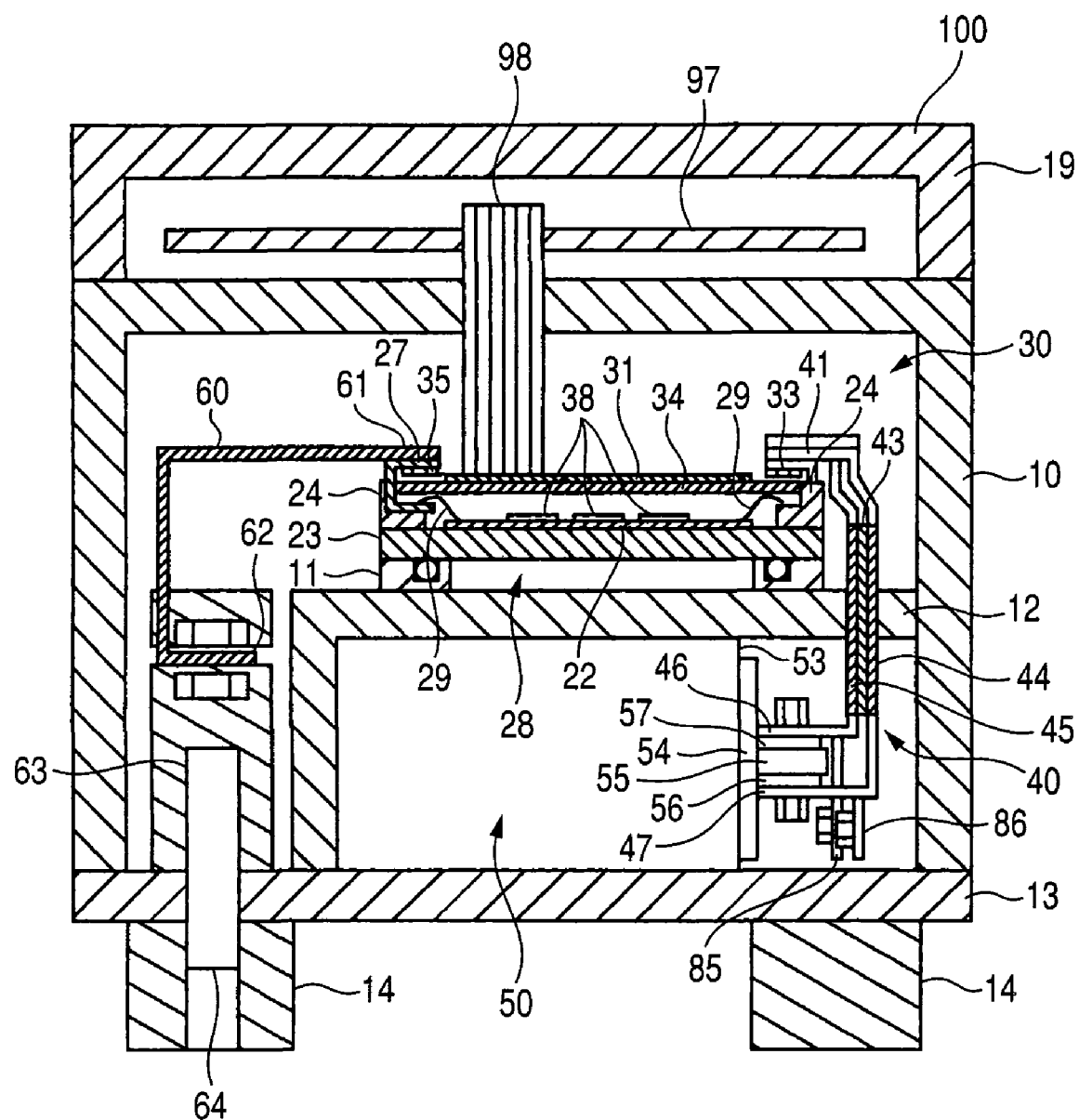
FIG. 16 is a cross sectional view showing a further embodiment relating to the power converter 100.

Even the embodiment having either of the left and right half structures has the effect of the power converter shown in FIGS. 2 to 13 or the power converter shown in FIGS. 14, 15, and 16.

Figure 17:
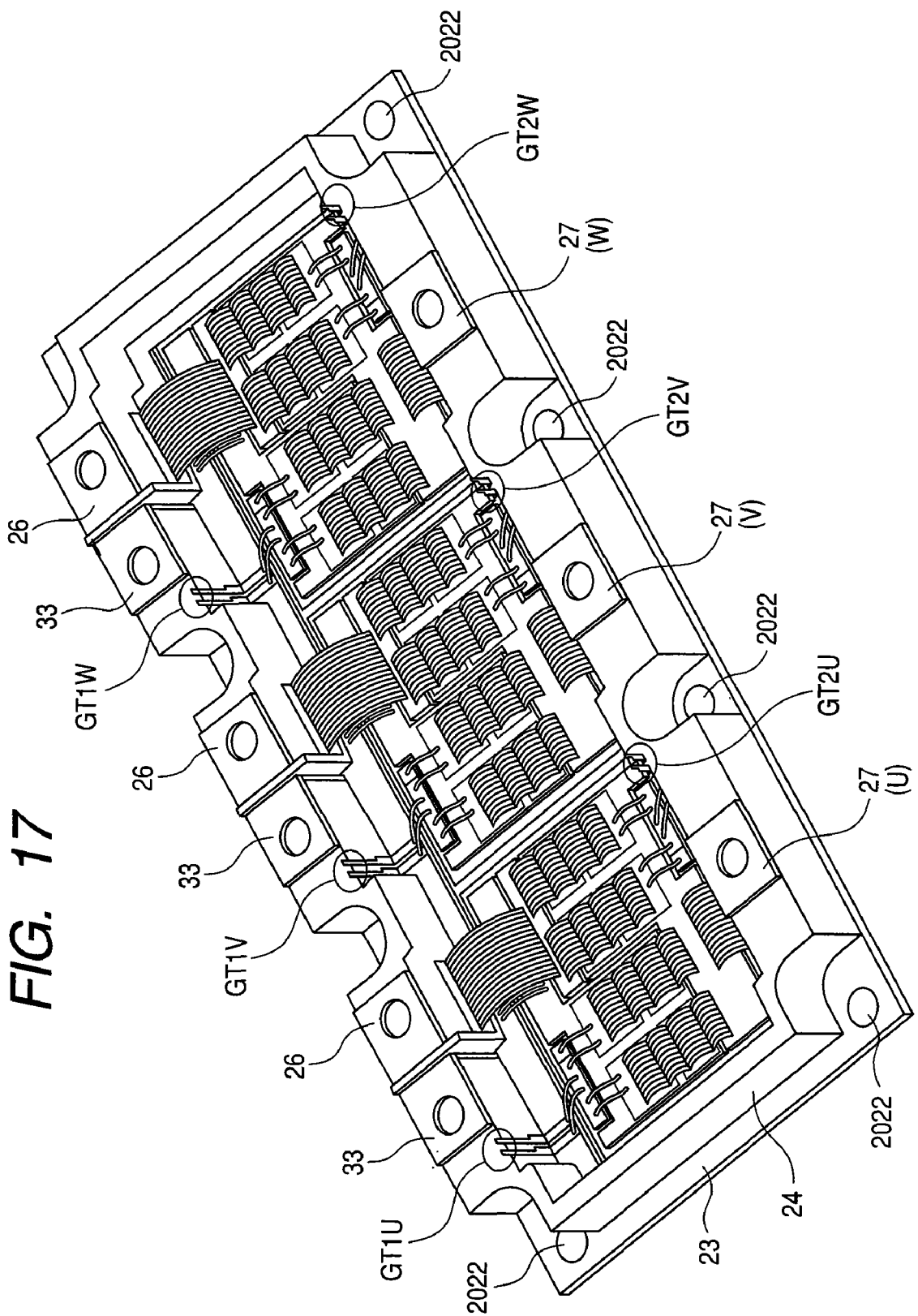
FIG. 17 is a perspective view showing another embodiment relating to the semiconductor module.

Next, an alternative plan of the semiconductor module 20 or 30 shown in FIG. 9 is shown in FIG. 17. The same numerals shown in FIG. 17 as those shown in FIG. 9 are the parts of the same targets though the action effects may be different slightly. The alternative plan shown in FIG. 17 shows the state that the resin cover is removed so as to be able to explain the internal structure of the semiconductor module and furthermore to assist the understanding, a partially enlarged view showing the state that the module case 24 is removed is shown in FIG. 18.

To one of the cooling plates 23, the IGBT 21 and diode 38 are fixed in the state of the semiconductor chip and are sealed by the resin-made module case 24. In this embodiment, slightly different from the embodiment shown in FIG. 4, 2 sets of circuits composed of the IGBT 21 and diode 38 are connected in parallel. The respect that the constitution of a parallel circuit is used to increase the current to be controlled is the same as that of the embodiment aforementioned.

The semiconductor modules 20 and 30 are almost rectangular similarly to the aforementioned embodiment and to one of the long sizes thereof, three sets of the positive module DC terminals 33 and negative module DC terminals 26 are fixed. On the other one of the long sizes of the semiconductor modules 20 and 30, three sets of the Module AC terminals 27 are installed. These module AC terminals 27 act as a terminal of the phases U, V, and W of the 3-phase alternating current. In the embodiment shown in FIG. 17, the parallel chips arranged on the left in the module case 24 compose the upper arms of the phase U and the parallel chips arranged on the right thereof compose the lower arms of the phase U. The parallel chips positioned on the right thereof compose the upper arms of the phase V and furthermore, the parallel chips positioned on the right thereof compose the lower arms of the phase V. Furthermore, the parallel chips positioned on the right thereof compose the upper arms of the phase W and furthermore, the parallel chips positioned on the right thereof compose the lower arms of the phase W.

Figure 18:
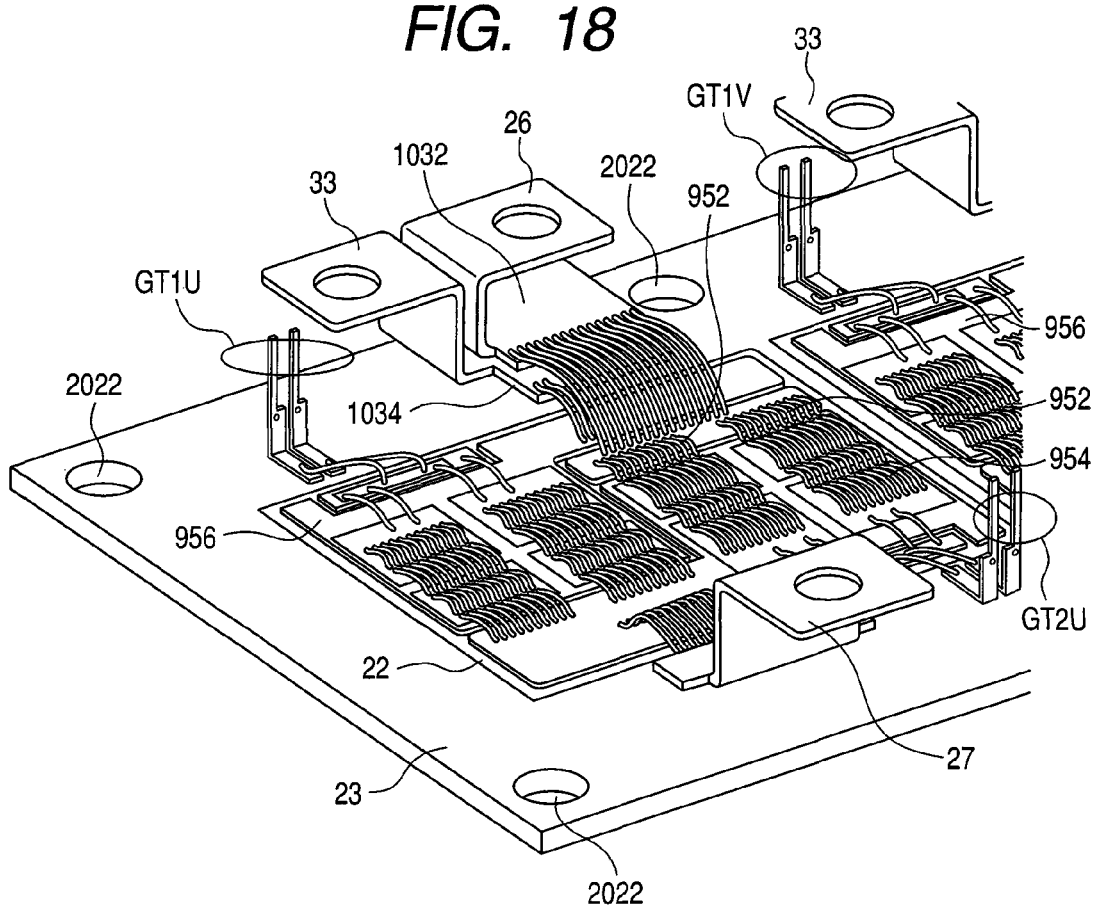
FIG. 18 is a perspective view showing partial enlargement of the semiconductor module relating to another embodiment.

In FIGS. 17 and 18, the positive module DC terminals 33 and negative module DC terminals 26 are respectively wide conductors forming a laminating structure holding an insulator therebetween. By this structure, the inductance of the circuit is suppressed low.

In FIGS. 17 and 18, terminals GT1U, GT1V, and GT1W are gate pins for adding gate signals of the IGBT for controlling the upper arms of the phases U, V, and W of the inverter circuit. Further, terminals GT2U, GT2V, and GT2W are gate pins for adding gate signals of the IGBT for controlling the lower arms of the phases U, V, and W of the inverter circuit.

A chip 952 of each of the IGBTs 21 and a chip 954 of each of the diodes 38 are loaded on an insulation board 956 made of nitride aluminum (AlN). The nitride aluminum (AlN) board 956 has satisfactory thermal conductivity. Further, instead of nitride aluminum (AlN), nitride silicon (SiN) can be used. Nitride silicon (SiN) has high toughness, so that the insulation board 956 can be formed thin.

The insulation board 956 is fixed on the cooling plate 23, and on the insulation board 956 on the side of the cooling plate 23, an overall pattern is formed by Ni-plated copper and on the side of the chip 952, a metal pattern is formed by Ni-plated copper. A metal is stuck on both sides of the insulation board 956, thus the chip 952 and cooling plate 23 can be soldered and the insulation board 956 is formed in a sandwich structure holding a metal therein. By use of such a constitution, the deformation due to a difference in the thermal expansion coefficient when the temperature is changed is prevented. As a result of use of the sandwich structure, when the insulation board 956 is thinned, according to changes in the current flowing in the metal pattern on the side of the chip 952 at time of switching, the eddy current induced in the overall pattern on the side of a metal base 944 is increased. As a result, the parasitic inductance of the metal pattern on the insulation board 956 can be reduced and it contributes to realization of low inductance of the power module.

Figure 19:
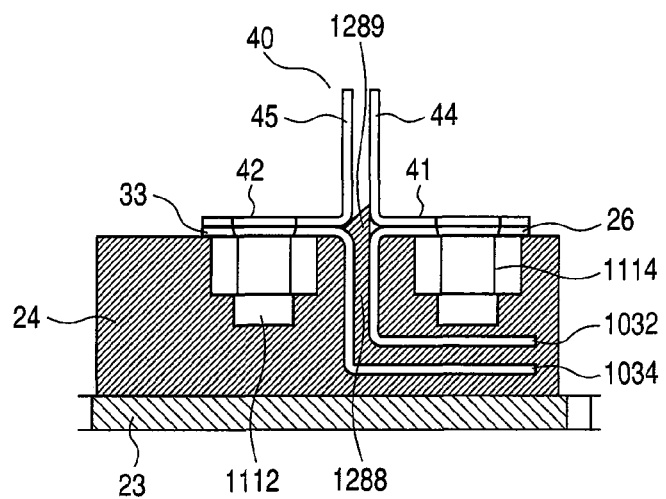
FIG. 19 is a cross sectional view of the DC terminal of the semiconductor module.
Figure 20:
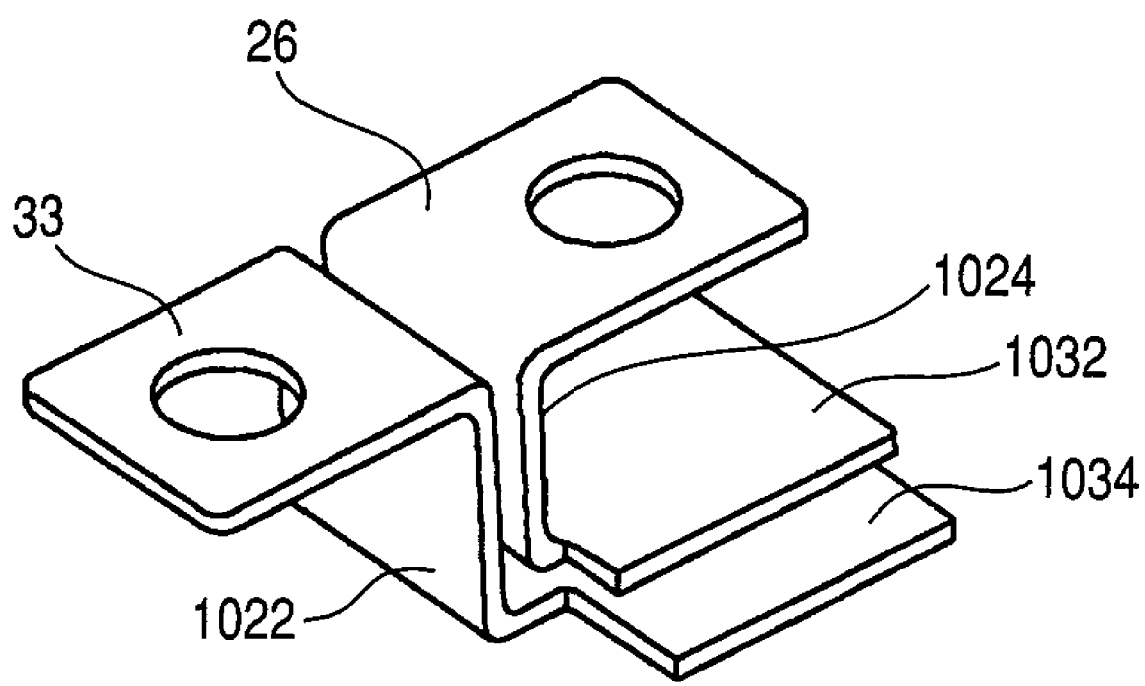
FIG. 20 is a perspective view showing the structure of the DC terminal of the semiconductor module.

The sections of the positive module DC terminals 33 and negative module DC terminals 26 shown in FIG. 17 are shown in FIG. 19 and the arrangement relationship and shapes of the positive module DC terminals 33 and negative module DC terminals 26 are shown in FIG. 20. In the drawings, as mentioned above, the positive module DC terminals 33 and negative module DC terminals 26 are wide conductors, which are arranged opposite to each other by holding an insulator therein. The ends of the positive module DC terminals 33 and negative module DC terminals 26 which are projected from the module cases 24 are bent respectively in the opposite directions and opposite ends 1034 and 1032 installed inside the module cases 24 are bent respectively in the same direction. The ends 1034 and 1032 are connections of the positive module DC terminals 33 and negative module DC terminals 26 and are embedded in resin. The reason that the connections 1032 and 1034 are different in length is that they are connected in parallel with the conductor connected electrically to the semiconductor chip. In the embodiment shown in FIG. 18, they are arranged in parallel by wire bonding and the inductance is reduced.

In FIG. 19, the operation of permitting the module terminal 42 of the positive DC busbar 45 and the module terminal 41 of the negative DC busbar 44 to make contact with the positive module DC terminals 33 and negative module DC terminals 26 is easy, so that nuts 1112 and 1114 are embedded in the module case 24 and as shown in FIGS. 17 to 20, a hole for letting a bolt pass through is formed in the conductor connection and a structure of tightening by a screw is formed.

In FIGS. 19 and 20, the reference numerals 1032 and 1034 are chip connections of the positive module DC terminals 33 and negative module DC terminals 26 and as mentioned above, are bent respectively in the same direction. As mentioned above, the chip connections of the positive and negative flat terminal conductors laminated via an insulator are bent in the same direction, thus the laminated flat conductor is composed of two surfaces and in parallel with the end side of the insulation board closest to the terminal, a metal pattern can be formed. Therefore, no unnecessary space is formed in the insulation board and the insulation board can be made compact. In FIG. 19, the wire-bondings are arranged in parallel and the currents flowing in the wire-bondings connected to the positive and negative terminals are opposite in direction. As a result, the magnetic fields formed by the currents act so as to cancel mutually, thus the inductance of the circuit is reduced.

In FIG. 19, the DC busbar 40 is composed of a laminating structure composed of the positive DC busbar 45 and negative DC busbar 44 with an insulation sheet 1289 held therebetween. When incorporating the insulation sheet 1289 at time of casting the power module case, to prevent it from melting by heat at about 300° C. at time of casting, it is preferable to use a high thermostable sheet such as polyamide-imide endurable at high temperature. Further, when inserting an insulation sheet between the terminals after casting the power module case, meta-aramid fibers (up to 260° C.) which are comparatively inexpensive and are endurable at 150° C. which is a maximum junction temperature of the semiconductor or higher can be used.

Further, when the insulation sheet 1289 is formed in a thickness of 50 μm or less, in a structure that the terminals are bent internally, the adhesion of the insulation sheet to the terminals at the bent portions can be improved.

According to the structure explained above, the whole inductance of the module and DC busbar can be reduced, for example, to 30 nH or less. Further, if a thin insulation board such as nitride silicon is used, the inductance can be reduced furthermore, for example, to 20 nH or less. Therefore, for example, even if the switching time (the required to switch from the on state to the off state) of the semiconductor chip of the inverter is reduced to 2 μs or less, furthermore to 1.2 μs or less, and furthermore to 1 μs or less, the voltage rise can be suppressed within the tolerance. Further, the ordinary DC voltage at this time is 300 V to 600 V. As a result, even if the maximum current change (di/dt) is set at 2 kA/μs, preferably 4 kA/μs, the semiconductor chip can be operated.

When the switching of the semiconductor chip is speeded up like this to shorten the switching time, the heat generation of the semiconductor chip at time of switching can be reduced, and the silicon area of the semiconductor chip can be made smaller, thus an inexpensive inverter can be realized.

In FIG. 3, the terminal holder 63 which is a connection with the outside in the AC power relationship is fixed to the thermally conductive housing and the connection with the outside in the AC power relationship is cooled efficiently. If as resin composing the terminal holder 63, thermally conductive resin is used, the connection is cooled more efficiently. Similarly in FIGS. 14 and 16, the resin-made terminal holder 63 is fixed to the thermally conductive housing and the connection with the outside in the AC power relationship is cooled efficiently. Therefore, the connection can be prevented from kept at a high temperature and the reliability of the connector such as the connection with an external connector is improved. If thermally conductive resin is used, the reliability is improved more. In an automobile, there are possibilities that it may be used in a severe state for many years and cooling the connection leads to improvement of the reliability relating to use for a long period of time. Further, the voltage of the AC power passing the connection becomes high and the flowing current is apt to increase. By radiating the heat of the connection by the thermally conductive housing, the connection is protected from high temperature, thus the reliability is improved.

What is claimed is:

1. A power converter comprising:
   a housing,
   a coolant path structure installed in said housing for forming a coolant path for letting a coolant pass,
   a capacitor arranged on one side of said coolant path structure in said housing, having a DC terminal,
   a power semiconductor circuit arranged on the other side of said coolant path structure in said housing, having a DC terminal, an AC terminal, and a power semiconductor chip for converting a direct current supplied from said DC terminal to an alternating current by an operation of said power semiconductor chip and outputting it from said AC terminal, and a first connecting wire for connecting electrically said DC terminal of said capacitor arranged on one side of said coolant path structure to said DC terminal of said power semiconductor circuit arranged on the other side of said coolant path structure by penetrating a hole formed in said coolant path structure, wherein:

DC power supplied to said housing is supplied to said DC terminal of said capacitor and to said DC terminal of said power semiconductor circuit, and is converted to AC power by said operation of said semiconductor chip, and said AC power is outputted from said AC terminal of said power semiconductor circuit.

2. The power converter according to claim 1, wherein:

said power semiconductor circuit has a semiconductor module including externally said DC terminal and said AC terminal and including internally said power semiconductor chip and said first connecting wire penetrating said coolant path structure connects electrically said DC terminal of said capacitor and said DC terminal of said semiconductor module.

3. The power converter according to claim 2, wherein:

said semiconductor module includes a metal base and a resin case fixed to said metal base, said power semiconductor chip is fixed to said metal base via an insulation board in said resin case, said DC terminal and said AC terminal arranged outside said resin case, and said metal base of said semiconductor module is fixed to said coolant path structure.

4. The power converter according to claim 3, wherein:

said coolant path structure forms at least two parallel coolant paths, said power semiconductor circuit has at least two semiconductor modules, said at least two semiconductor modules are arranged respectively in correspondence with two cooling paths and said at least two semiconductor modules are fixed to said coolant path structure so that said DC terminals of said at least two semiconductor modules approach each other, and said first connecting wire penetrating said coolant path structure is arranged between said two parallel coolant paths.

5. A power converter comprising:

a metal housing, a coolant inlet installed in said metal housing, a coolant outlet installed in said metal housing, a coolant path structure for forming a coolant path for leading a coolant flowing in from said coolant inlet to said coolant outlet in said housing, fixed mechanically to said metal housing, a capacitor arranged on one side of said coolant path structure in said housing, having a DC terminal, a power semiconductor circuit arranged on the other side of said coolant path structure in said housing, having a DC terminal, an AC terminal, and a power semiconductor chip for converting a direct current supplied from said DC terminal to an alternating current by an operation of said power semiconductor chip and outputting it from said AC terminal, and a first connecting wire for connecting electrically said DC terminal of said capacitor arranged on one side of said coolant path structure to said DC terminal of said power semiconductor circuit arranged on the other side of said coolant path structure by penetrating a hole formed through said coolant path structure, wherein:

said first connecting wire forms a laminating structure holding an insulator therebetween and DC power supplied to said housing is supplied to said DC terminal of said capacitor and to said DC terminal of said power semiconductor circuit, and is converted to AC power by said operation of said semiconductor chip, and said AC power is outputted from said AC terminal of said power semiconductor circuit.

6. The power converter according to claim 5, wherein:

said power semiconductor circuit has an almost rectangular semiconductor module including externally said DC terminal and said AC terminal and including internally said power semiconductor chip, said semiconductor module is fixed to said coolant path structure so that long sides of said rectangular semiconductor module coincide with a flow direction of a coolant flowing in said coolant path, said hole is formed at a part of said coolant path structure positioned on a side of said coolant path, and said first connecting wire penetrating said coolant path structure connects electrically said DC terminal of said capacitor and said DC terminal of said semiconductor module via said hole formed in said coolant path structure.

7. The power converter according to claim 6, wherein:

said semiconductor module includes an almost rectangular metal base and an almost rectangular resin case fixed to said metal base, said power semiconductor chip is fixed to said metal base via an insulation board in said resin case, said DC terminal is arranged on one long side of said almost rectangular resin case, said AC terminal is arranged on the other long side of said almost rectangular resin case, and so that long sides of said metal base of said semiconductor module coincide with said flow direction of said coolant in said coolant path and moreover said DC terminal of the said semiconductor module is arranged on the side of said hole formed in said coolant path structure, said metal base is fixed to said coolant path structure.

8. The power converter according to claim 7, wherein:

an AC power terminal for supplying AC power to a motor is mounted on said metal housing and said AC terminal of said semiconductor module and said AC power terminal are connected electrically with a second bar connecting wire.

9. The power converter according to claim 8, wherein:

said coolant path structure forms at least two parallel coolant paths, said power semiconductor circuit has at least two semiconductor modules, said at least two semiconductor modules are arranged respectively in correspondence with two cooling paths and said at least two semiconductor modules are fixed to said coolant path structure so that said DC terminals of said at least two semiconductor modules are put into an arrangement relationship of approaching each other, and said hole permitting said first connecting wire to penetrate is installed in said coolant path structure positioned between said two parallel coolant paths and outside said two parallel coolant paths, said second connecting wire is arranged.

10. A power converter comprising:
a housing,
a coolant path structure installed in said housing for forming a coolant path for letting a coolant pass,
a capacitor arranged on one side of said coolant path structure in said housing, having a DC terminal,
a power semiconductor circuit arranged on the other side of said coolant path structure in said housing, having a metal base, a resin case fixed to said metal base, a DC terminal and an AC terminal arranged outside said resin case, a power semiconductor chip fixed to one surface of said metal base via an insulation board in said resin case, and cooling fins fixed to the other surface of said metal base for converting a direct current supplied from said DC terminal to an alternating current by an operation of said power semiconductor chip and outputting it from said AC terminal, and
a first connecting wire penetrating said coolant path structure for connecting electrically said DC terminal of said capacitor arranged on one side of said coolant path structure to said DC terminal of said power semiconductor circuit arranged on the other side of said coolant path structure, wherein:
said coolant path formed by said coolant path structure has an opening,
said cooling fins of said power semiconductor circuit are projected into said coolant path from said opening of said coolant path and said power semiconductor circuit is fixed to said coolant path structure so as to seal said opening of said coolant path by said metal base of said power semiconductor circuit,
a hole is formed at a part of said coolant path structure positioned on a side of said opening of said coolant path,
said first connecting wire penetrating said coolant path structure connects electrically said DC terminal of said capacitor and said DC terminal of said semiconductor circuit via said hole, and
DC power supplied to said housing is supplied to said DC terminal of said capacitor and to said DC terminal of said power semiconductor circuit, and is converted to AC power by said operation of said semiconductor chip and said AC power is outputted from said AC terminal of said power semiconductor circuit.

11. The power converter according to claim 10, wherein:
said metal base of said power semiconductor circuit is almost rectangular,
said DC terminal is arranged outside said resin case positioned on one long side of said almost rectangular metal base,
said AC terminal is arranged outside said resin case positioned on the other long side of said almost rectangular metal base,
said opening of said coolant path is long and narrow in the flowing direction of said coolant, and
so that long sides of said metal base of said semiconductor circuit coincide with a flow direction of said coolant, said metal base of said power semiconductor circuit is fixed to said coolant path structure.

12. The power converter according to claim 11, wherein:
said coolant path structure forms at least two parallel coolant paths,
almost rectangular openings long in the flowing direction are formed respectively in said coolant paths,
said power semiconductor circuit has at least two sets of metal bases including said resin case, said DC terminal and said AC terminal arranged on said resin case, said power semiconductor chip fixed to one surface via an insulation board, and said cooling fins fixed to the other surface,
said metal bases have a plurality of holes for fixing by screws around them,
said metal bases seal said openings of said coolant paths and so that said cooling fins held by said metal bases are projected from said openings into the coolant paths and furthermore said DC terminals held by said metal bases approach each other, are fixed to said coolant path structure by screws,
a hole is formed at a part of said coolant path structure positioned between said two parallel coolant paths, and
said first connecting wire penetrating said coolant path structure connects electrically said DC terminal of said capacitor and said DC terminal of said semiconductor circuit via said hole.

13. A power converter comprising:
a metal housing,
a coolant inlet installed in said metal housing,
a coolant outlet installed in said metal housing,
a coolant path structure for leading a coolant flowing in from said coolant inlet to said coolant outlet in said housing, fixed mechanically to said metal housing for forming a coolant path,
a capacitor arranged on one side of said coolant path structure in said housing, having a DC terminal,
a power semiconductor circuit arranged on the other side of said coolant path structure in said housing, having a DC terminal, an AC terminal, and a power semiconductor chip for converting a direct current supplied from said DC terminal to an alternating current by an operation of said power semiconductor chip and outputting it from said AC terminal, and
a first connecting wire penetrating said coolant path structure for connecting electrically said DC terminal of said capacitor arranged on one side of said coolant path structure to said DC terminal of said power semiconductor circuit arranged on the other side of said coolant path structure, wherein:
said coolant path has an opening,
said power semiconductor circuit has cooling fins,
said power semiconductor circuit is arranged so that said cooling fins are projected internally into said opening of said coolant path,
DC power supplied to said housing is supplied to said DC terminal of said capacitor and said DC terminal of said power semiconductor circuit, and said supplied DC power is converted to AC power by said operation of said semiconductor chip, and said AC power is outputted from said AC terminal of said power semiconductor circuit,
said power semiconductor circuit has an almost rectangular semiconductor module including externally said DC terminal and said AC terminal and including internally said power semiconductor chip,
said semiconductor module is fixed to said coolant path structure so that long sides of said rectangular semiconductor module coincide with a flow direction of a coolant in said coolant path,
a hole is formed at a part of said coolant path structure positioned on a side of said opening of said coolant path, and
said first connecting wire penetrating said coolant path structure connects electrically said DC terminal of said capacitor and said DC terminal of said semiconductor module via said hole formed in said coolant path structure.

14. The power converter according to claim 13, wherein:

said semiconductor module includes an almost rectangular metal base and a resin case fixed to one surface of said metal base, said power semiconductor chip is fixed to one surface of said metal base via an insulation board in said resin case, said DC terminal is arranged at a part of said resin case positioned on one almost rectangular long side of said metal base, said AC terminal is arranged at a part of said resin case positioned on the other almost rectangular long side of said metal base, said cooling fins are fixed to the other surface of said metal base, said opening of said coolant path has an almost rectangular shape long in said flowing direction of said coolant, and said cooling fins of said semiconductor module are projected into said opening and said opening is sealed by said metal base of said semiconductor module.

15. The power converter according to claim 14, wherein:

an AC power terminal for supplying AC power to a motor is mounted on said metal housing and said AC terminal of said semiconductor module and said AC power terminal are connected electrically with a second bar connecting wire.

16. The power converter according to claim 15, wherein:

said coolant path structure forms at least two parallel coolant paths, said opening is formed in each of said coolant paths, said power semiconductor circuit has at least two sets of said semiconductor modules, each of said semiconductor modules is fixed to said coolant path structure so that said cooling fins of each of said semiconductor modules is projected internally from each of said openings, and said hole permitting said first connecting wire to penetrate is installed in said coolant path structure positioned between said two parallel coolant paths.

17. The power converter according to claim 16, wherein:

said two semiconductor modules are fixed so that said DC terminals of said at least two semiconductor modules are arranged inside said two parallel coolant paths and said second connecting wire is arranged outside said two parallel coolant paths.

18. A power converter comprising:

a metal housing, an engine coolant inlet installed in said metal housing, an engine coolant outlet installed in said metal housing, a coolant path structure for forming a coolant path for leading an engine coolant flowing in from said coolant inlet to said coolant outlet in said housing, fixed mechanically to said metal housing, a capacitor arranged on one side of said coolant path structure in said housing, having a DC terminal, a power semiconductor circuit arranged on the other side of said coolant path structure in said housing, having a DC terminal, an AC terminal, and a power semiconductor chip for converting a direct current supplied from said DC terminal to an alternating current by an operation of said power semiconductor chip and outputting it from said AC terminal, and a first connecting wire penetrating said coolant path structure for connecting electrically said DC terminal of said capacitor arranged on one side of said coolant path structure to said DC terminal of said power semiconductor circuit arranged on the other side of said coolant path structure, wherein:

said coolant path has an opening, said power semiconductor circuit has cooling fins, said power semiconductor circuit is arranged so that said cooling fins are projected internally into said opening of said coolant path, DC power supplied to said housing is supplied to said DC terminal of said capacitor and said DC terminal of said power semiconductor circuit, and said supplied DC power is converted to AC power by said operation of said semiconductor chip, and said AC power is outputted from said AC terminal of said power semiconductor circuit, said power semiconductor circuit has an almost rectangular semiconductor module including externally said DC terminal and said AC terminal and including internally said power semiconductor chip, said semiconductor module is fixed to said coolant path structure so that long sides of said rectangular semiconductor module coincide with a flow direction of an engine coolant flowing in said coolant path, a first hole is formed at a part of said coolant path structure positioned on a side of said opening of said coolant path, and said first connecting wire penetrating said coolant path structure connects electrically said DC terminal of said capacitor and said DC terminal of said semiconductor module via said first hole formed in said coolant path structure.

19. The power converter according to claim 18, wherein:

said semiconductor module includes an almost rectangular metal base and a resin case fixed to one surface of said metal base, said power semiconductor chip is fixed to one surface of said metal base via an insulation board in said resin case, said DC terminal is arranged at a part of said resin case positioned on one almost rectangular long side of said metal base, said AC terminal is arranged at a part of said resin case positioned on the other almost rectangular long side of said metal base, said cooling fins are fixed to the other surface of said metal base, said opening of said coolant path has an almost rectangular shape long in said flowing direction of said engine coolant, and said cooling fins of said semiconductor module are projected into said opening and said opening is sealed by said metal base of said semiconductor module.

20. The power converter according to claim 19, wherein:

an AC power terminal for supplying AC power to a motor is mounted on said metal housing, said AC terminal of said semiconductor module and said AC power terminal are connected electrically with a second bar connecting wire, and a second hole is formed at a part of said coolant path structure positioned on the opposite side to said first hole formed in said coolant path structure for said opening of said coolant path and said second connecting wire is arranged so as to penetrate said second hole.

21. The power converter according to claim 20, wherein:
said coolant path structure forms at least two parallel coolant paths,
said opening is formed in each of said coolant paths,
said power semiconductor circuit has at least two sets of said semiconductor modules,
each of said semiconductor modules is fixed to said coolant path structure so that said cooling fins of each of said semiconductor modules is projected internally from each of said openings,
said first hole permitting said first connecting wire to penetrate is installed in said coolant path structure positioned between said two parallel coolant paths, and
said second holes permitting said second connecting wire to penetrate are installed respectively in said coolant path structures positioned outside said two parallel coolant paths.

* * * * *